(12) United States Patent
Sakimura et al.

(10) Patent No.: US 7,646,628 B2
(45) Date of Patent: Jan. 12, 2010

(54) TOGGLE MAGNETIC RANDOM ACCESS MEMORY AND WRITE METHOD OF TOGGLE MAGNETIC RANDOM ACCESS MEMORY

(75) Inventors: Noboru Sakimura, Tokyo (JP); Takeshi Honda, Tokyo (JP); Tadahiko Sugibayashi, Tokyo (JP)

(73) Assignee: NEC Corporation (JP)

( * ) Notice: Subject to any disclaimer, the term of this patent is extended or adjusted under 35 U.S.C. 154(b) by 314 days.

(21) Appl. No.: 11/815,720

(22) PCT Filed: Feb. 8, 2006

(86) PCT No.: PCT/JP2006/302153

§ 371 (c)(1),
(2), (4) Date: Sep. 26, 2007

(87) PCT Pub. No.: WO2006/085545

PCT Pub. Date: Aug. 17, 2006

(65) Prior Publication Data

US 2009/0010044 A1 Jan. 8, 2009

(30) Foreign Application Priority Data

Feb. 9, 2005 (JP) ............................. 2005-033713

(51) Int. Cl.
*G11C 11/00* (2006.01)
(52) U.S. Cl. ............. 365/158; 365/189.02; 365/189.16; 365/233.18; 365/189.19
(58) Field of Classification Search ................. 365/158, 365/189.02, 189.16, 233.18, 189.19
See application file for complete search history.

(56) References Cited

U.S. PATENT DOCUMENTS

| 4,782,340 | A | 11/1988 | Czubatyj et al. |
| 5,224,213 | A * | 6/1993 | Dieffenderfer et al. ........ 710/53 |
| 6,333,890 | B1 | 12/2001 | Niimi et al. |
| 6,545,906 | B1 | 4/2003 | Savtchenko et al. |
| 6,693,824 | B2 | 2/2004 | Nahas et al. |
| 6,744,663 | B2 | 6/2004 | Garni et al. |
| 7,006,404 | B1 * | 2/2006 | Manapat et al. ........ 365/189.14 |
| 7,099,179 | B2 * | 8/2006 | Rinerson et al. ............ 365/148 |
| 7,209,382 | B2 | 4/2007 | Iwata et al. |

(Continued)

FOREIGN PATENT DOCUMENTS

JP 2001-135078 A 5/2001

(Continued)

*Primary Examiner*—Viet Q Nguyen
(74) *Attorney, Agent, or Firm*—Dickstein, Shapiro, LLP.

(57) ABSTRACT

A toggle magnetic random access memory includes a first memory array, a second memory array and a controller. The first memory array includes a plurality of first memory cells including magnetoresistive elements. The second memory array includes a plurality of second memory cells including magnetoresistive elements and differs from the first memory array in write wirings used for writing. The controller controls the first memory array and the second memory array such that a first state in which a first burst write operation in the first memory array is executed and a second state in which a second burst write operation in the second memory array is executed are alternately executed in a continuous burst write mode. Accordingly, the continuous burst write operation can be executed at the high speed without any drop in the reliability and any increase in the circuit area.

40 Claims, 16 Drawing Sheets

U.S. PATENT DOCUMENTS

| | | |
|---|---|---|
| 7,301,829 B2 | 11/2007 | Honda et al. |
| 7,345,839 B2 * | 3/2008 | Elliott et al. .................. 360/51 |
| 7,543,211 B2 * | 6/2009 | Nahas et al. ................ 714/752 |
| 2004/0008536 A1 | 1/2004 | Garni et al. |
| 2009/0161423 A1 * | 6/2009 | Sugibayashi et al. ........ 365/171 |

FOREIGN PATENT DOCUMENTS

| | | |
|---|---|---|
| JP | 2003-077267 A | 3/2003 |
| JP | 2003-109374 A | 4/2003 |
| JP | 2003-331574 A | 11/2003 |
| JP | 2003-346473 A | 12/2003 |
| JP | 2004-086986 A | 3/2004 |
| JP | 2004-234816 A | 8/2004 |
| JP | 2004-530240 A | 9/2004 |
| WO | WO-2004/003922 A1 | 1/2004 |

* cited by examiner

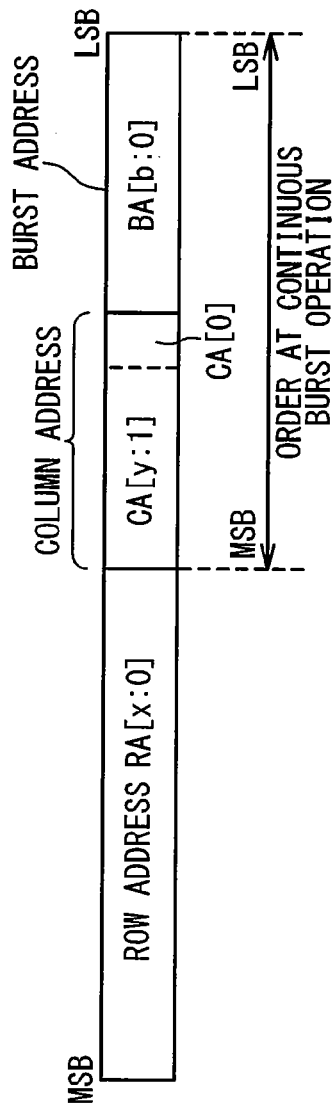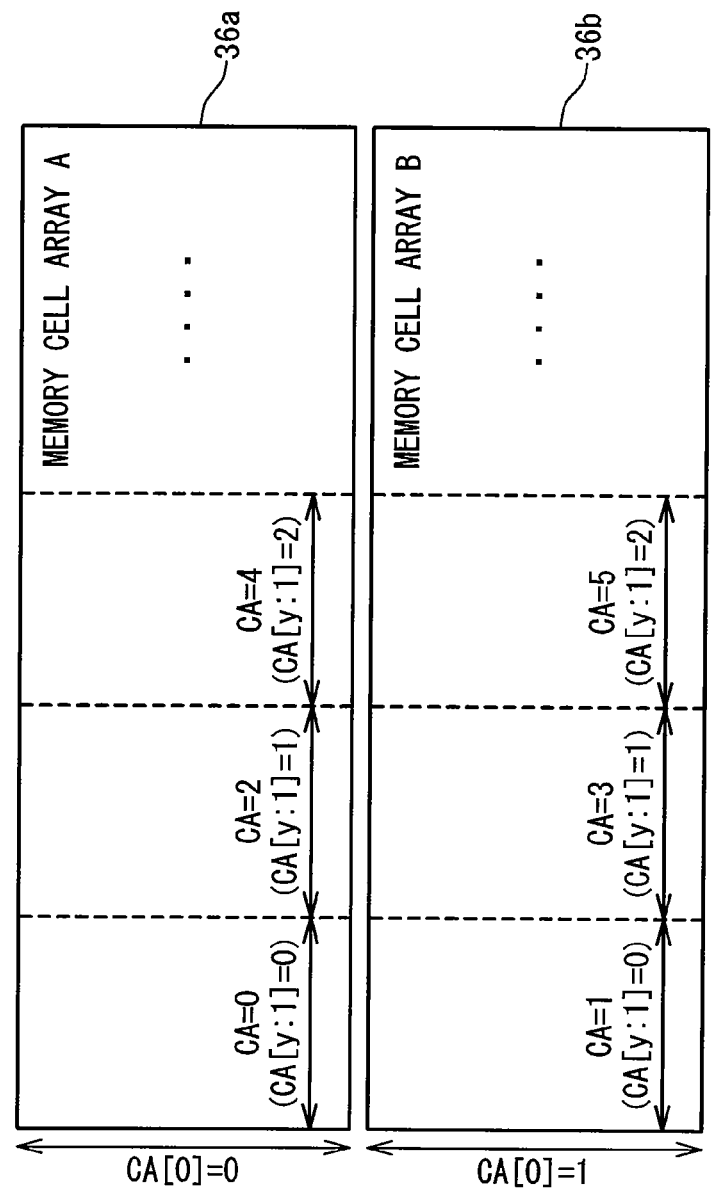

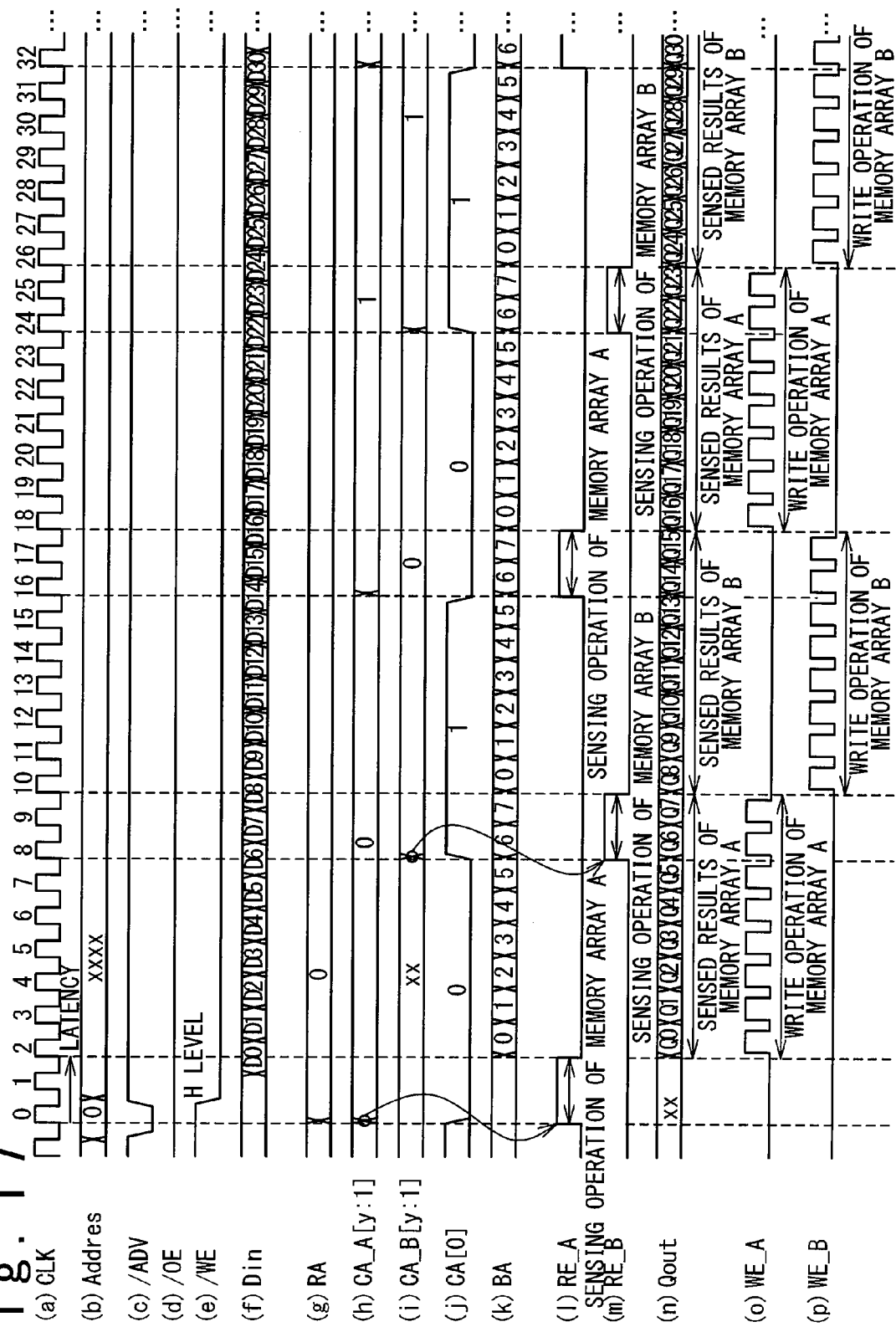

TOGGLE MAGNETIC RANDOM ACCESS MEMORY AND WRITE METHOD OF TOGGLE MAGNETIC RANDOM ACCESS MEMORY

TECHNICAL FIELD

The present invention relates to a toggle magnetic random access memory (hereafter, referred to as toggle MRAM) and a write method of toggle MRAM, and more particularly relates to a toggle MRAM and a write method of a toggle MRAM, which executes a continuous burst write operation at a high reliability.

BACKGROUND ART

A magnetic random access memory (MRAM) capable of high-speed write and read operations is a non-volatile memory which can perform a number of rewrite operations, and is expected as a memory substituted for an existing DRAM or SRAM.

As one of the MRAMs, U.S. Pat. No. 6,545,906 discloses a toggle MRAM. In the toggle MRAM, a magnetic tunneling junction (MTJ) is used as a storage element, in which a laminated free layer is used. This toggle MRAM differs from the conventional typical MRAM in a memory cell structure and a write operation principle, and is particularly superior in a selection property of the memory cell in the write operation.

As described in U.S. Pat. No. 6,545,906, the MTJ structure used in the toggle MRAM is such that a first free layer and a second free layer, which are equal in film thickness, are laminated through a non-magnetic metal layer. A pinned layer and a reference layer under the free layer are also laminated through a non-magnetic metal layer. The magnetization directions of the pinned layer and the reference layer are strongly fixed when they are manufactured. The directions of a first free layer magnetization of the first free layer and a second free layer magnetization of the second free layer can be changed, for example, by magnetic fields generated by the write currents flowing through a write bit line and a write word line. Here, the first and second free layer magnetizations are stable in an anti-parallel state in which they are inverse to each other at 180 degrees.

FIG. 1 shows a planar layout of the memory cell in the toggle MRAM described in U.S. Pat. No. 6,545,906. The planar layout of the memory cell in the toggle MRAM differs from that of the conventional typical MRAM. In the toggle MRAM, a magnetization easy axis direction of a MTJ 125 is arranged, for example, at a direction inclined at about 45 degrees from an X-direction in which a write word line 123 extends and a Y-direction in which a write bit line 121 extends. This is intended to simplify a toggle operation, which will be described later.

The sensing operation principle of the toggle MRAM is similar to the sensing operation principle of the conventional typical MRAM. However, the write operation principle of the toggle MRAM differs from the conventional typical MRAM. The write operation principle of the toggle MRAM will be described below. The write operation of the toggle MRAM disclosed in U.S. Pat. No. 6,545,906 executes in advance the sensing of a selected memory cell. Then, its sensing result and a data to be written are compared, and if they correspond to each other, the write operation is not executed, and if they are not corresponds to each other, the write operation is executed. The write operation is executed by changing the first and second free layer magnetizations (executing the toggle operation).

FIGS. 2 to 4 are views showing the toggle operation principle of the conventional toggle MRAM. In the toggle operation, as shown in FIG. 2, a write current $I_{WL}$ is supplied to the write word line 123 at a time t1, and a write current $I_{BL}$ is supplied to the write bit line 121 at a time t2. Moreover, at a time t3, the write current $I_{WL}$ is stopped, and at a time t4, the write current $I_{BL}$ is stopped. With the series of the current controls, a rotational magnetic field is applied to the intersection between the write word line in a selection state to which the write current $I_{WL}$ is supplied and the write bit line in a selection state to which the write current $I_{BL}$ is supplied. In association with this, each of the first and second free layer magnetizations of the MTJ is rotated (the toggle operation is carried out) in a spin flop state. That is, as shown in FIG. 3, in a case that an initial state is a [0] state, it is rewritten (toggled) to a [1] state. As shown in FIG. 4, in the case of the [1] state, it is rewritten (toggled) to the [0] state. In the toggle MRAM, only one directional magnetic field is applied to memory cells in a half-selection state that is arranged on the write word line 123 in the selection state or on the write bit line 121 in the selection state. Thus, a possibility of an erroneous writing is very low. Hence, it is not required to strictly control the write current value, which dramatically improves the write margin, as compared with the conventional typical MRAM.

In a typical clock synchronous RAM, a burst operation is prepared in specifications. This is the technique that automatically changes an inner burst address in synchronization with a clock and consequently attains high-speed read and write operations. In particular, in a continuous burst operation in the specifications, all of column addresses including the bust address are changed and operated synchronously with the clock. FIG. 5 is a view showing a timing chart of a continuous burst read operation. Here, (a) indicates a clock signal, (b) indicates an address signal, (c) indicates an address advance signal, (d) indicates an output enable signal, (e) indicates a write enable signal, (f) indicates a column address signal, (g) indicates a burst address signal, and (h) indicates a signal inputted/outputted through input/output pins, respectively. In this continuous burst read operation, the sensing results of the memory cells corresponding to all of the column addresses are sequentially outputted synchronously with the clock.

FIG. 6 is a view showing a timing chart of a continuous burst write operation. Here, (a) indicates a clock signal, (b) indicates an address signal, (c) indicates an address advance signal, (d) indicates an output enable signal, (e) indicates a write enable signal, (f) indicates a signal inputted/outputted through input/output pins, (g) indicates a column address signal, (h) indicates a burst address signal, and (i) indicates a write data signal, respectively. In this continuous burst write operation, the write data inputted synchronously with the clock are sequentially written to the memory cells corresponding to all of the column addresses including the burst address.

Here, the write operation of the typical MRAM can control the free layer magnetization of the MTJ element, depending on the direction of the write current corresponding to the write data. Thus, the existing RAM technique can be applied in its original state to similarly execute the continuous burst write operation.

However, the write operation of the toggle MRAM is executed, depending on whether or not the free layer magnetization is inverted (toggle-operated). For this reason, prior to the toggle operation, in order to determine whether or not the toggle operation is executed, it is required to sense the state of the memory cell. This fact causes the execution of the continuous burst write operation of the toggle MRAM to be very difficult. For example, if the sensing operations of the memory cells corresponding to the all column addresses are executed in the period until the start of the burst write operation after the input of the addresses, it is possible to execute the continuous burst write operation even in the toggle MRAM. However, all of the bit lines require the sense amplifier. Thus, this is impractical because a circuit area is explosively increased. Also, when the sense amplifiers whose number is fewer than that of the bit lines are used to cope with all of the column addresses, the sensing operations for different memory cells are required to be executed simultaneously with the burst write operation.

FIG. 7 is a view showing an example of a timing chart of the continuous burst write operation in the toggle MRAM. Here, (a) indicates a clock signal CLK, (b) indicates an address signal Address, (c) indicates an address advance signal /ADV, (d) indicates an output enable signal /OE, (e) indicates a write enable signal /WE, (f) indicates a signal Din inputted/outputted through input/output pins, (g) indicates a row address signal RA, (h) indicates a burst address signal BA, (i) indicates a read column address signal RCA, (j) indicates a read enable signal RE, (k) indicates a sense amplifier output signal Qout, (l) indicates a write column address signal WCA, (m) indicates an inner write enable signal WE, (n) indicates a write current (Ix), and (o) indicates a write current (Iy), respectively.

This continuous burst write operation separates the column address into the two systems for the sensing operation and the write operation. That is, the column address is separated into the (i) read column address signal RCA for selecting only the memory cell to which the sensing operation is possible and the (l) write column address signal WCA for selecting only the memory cell to which the write operation is possible. The WCA signal is outputted while having a delay (latency) of several clocks behind the RCA signal. FIG. 7 exemplifies a case of a latency=2 (clocks).

In FIG. 7, the following operations are executed at the respective cycles of the CLK signal after the address signal is supplied.

(1) From 0th to 1st Cycles

A sensing operation A is executed for memory cells A which are located at a column address of 0 and burst addresses of 0 to 7 (the (i) RCA signal, the (j) RE signal).

(2) From 2nd to 9th Cycles

These sensing results of the memory cells A and the data input signal inputted from outside are used to execute the burst write operation (the (k) Qout signal, the (f) Din signal, the (e)/WE signal, the (h) BA signal, the (l) WCA signal, the (m) WE signal, the (n) Ix signal and the (o) Iy signal).

(3) From 8th to 9th Cycles

A sensing operation B for memory cells B which are located at a column address of 0 and burst addresses of 0 to 7 is executed (the (i) RCA signal, the (j) RE signal).

(4) From 10th to 17th Cycles

The sensing result of the memory cells B and the data input signal inputted from outside are used to execute the burst write operation (the (k) Qout signal, the (f) Din signal, the (e)/WE signal, the (h) BA signal, the (l) WCA signal, the (m) WE signal, the (n) Ix signal and the (o) Iy signal).

The subsequent operations will be similarly executed.

FIG. 8 is a view showing a situation of a memory array at the 9th cycle of the CLK signal in FIG. 7.

The write currents Ix, Iy flow through the write word line 123 and the write bit line 121, respectively, in the memory cell A which is located at the column address of 0 (the (l) WCA signal) and the burst address (the (h) BA signal) of 7, respectively. At the same time, the sensing operation of the memory cell B which is located at the column address of 1 ((i) the RCA signal) is executed. At this time, the write current Ix flows through the write word line 123 of the memory cell B. Thus, the magnetization of the memory cell B is in the unstable state (the spin-flop state) that is neither at [0] nor at [1]. Thus, the data stored in the memory cell B cannot be rightly sensed. In this way, since there is the cycle in which the sensing operation and the write operation are executed at the same time, it is difficult to execute the continuous burst write operation.

If the sensing operation is executed for each clock cycle, there is a possibility that the foregoing problems can be solved. However, in that case, it is difficult to make a clock frequency high. This results in the drop in the speed of the write operation. If so, the merit of the execution of the continuous burst write operation is lost.

As the related art, Japanese Laid-Open Patent Application (JP-P 2003-77267A) discloses a thin film magnetic substance storage device. This thin film magnetic substance storage device includes a memory array including a plurality of memory cells that are arranged in a matrix shape. The electric resistance of each of the memory cells is changed in accordance with the storage data that is magnetically written by first and second data write currents. This includes a plurality of write digit lines, a plurality of write bit lines, a plurality of word lines, and a column selecting unit. Each of the plurality of write digit lines is provided correspondingly to each of memory cell columns, and when they are active, the first data write current is supplied to a column direction. Each of the plurality of write bit lines is provided correspondingly to each of memory cell rows, and when they are active, the second data write current is supplied to the row direction. Each of the plurality of word lines is provided correspondingly to each of the memory cell columns, and the selection column including the selection memory cell selected as a data read target is active. The column selecting unit executes the column selection in the memory array. The column selecting unit executes the column selection in the memory array. The column selecting unit includes a column decoding circuit, a word line selecting circuit and a write digit line selecting circuit. The column decoding circuit decodes a column address. The word line selecting circuit is provided correspondingly to each word line, and activates the corresponding word line, in accordance with the decoded result of the corresponding memory cell column, when the data is read. The write digit line selecting circuit is provided correspondingly to each of the write digit lines and activates the corresponding write digit line, in accordance with the decoded result of the corresponding memory cell column, when the data is written.

Japanese Laid-Open Patent Application (JP-P 2004-530240A) discloses a MRAM architecture and system. This magnetic resistance memory is formed on a common substrate. The magnetic resistance memory is provided with first and second magnetic resistance memory arrays, a plurality of word/digit lines, a switching circuit and a current source. The first and second magnetic resistance memory arrays are provided on the substrate, separately from each other, and each of them has a plurality of magnetic resistance memory cells arranged in a plurality of columns and rows. Each of the plurality of word/digit lines is magnetically coupled to the magnetic memory cell on each column in each of the first and second magnetic resistance memory arrays. The switching circuit is provided between the first and second magnetic resistance memory arrays on the substrate and designed to select the word/digit line in the magnetic resistance memory cell on any or one of the first and second magnetic resistance memory arrays. The current source is provided adjacently to the switching circuit on the substrate and connected to the switching circuit, in order to supply the write current to the selected word/digit line in the magnetic resistance memory cell on the column.

DISCLOSURE OF INVENTION

An object of the present invention is to provide a toggle MRAM and a write method of a toggle MRAM, which attain a continuous burst write operation at a high speed without any increase in a circuit area.

Another object of the present invention is to provide a toggle MRAM and a write method of a toggle MRAM, which attain a continuous burst write operation at a high speed without any drop in a reliability of a write operation.

This and other objects, features and advantages of the present invention will be readily ascertained by referring to the following description and drawings.

In order to solve the above-mentioned problem, a toggle magnetic random access memory of the present invention includes a first memory array, a second memory array and a controller. The first memory array includes a plurality of first memory cells including magnetoresistive elements. The second memory array includes a plurality of second memory cells including magnetoresistive elements and differs from the first memory array in write wirings used for writing. The controller controls the first memory array and the second memory array such that a first state in which a first burst write operation in the first memory array is executed and a second state in which a second burst write operation in the second memory array is executed are alternately executed in a continuous burst write mode.

In the toggle magnetic random access memory, the first memory array and the second memory array input and output data from the same input output pins.

In the toggle magnetic random access memory, the first memory array or second memory array includes: a plurality of write word lines extending in a first direction as one of the write wirings; and a plurality of bit lines extending in a second direction as the other one of the write wirings. Each of the plurality of first memory cells or each of the plurality of second memory cells is arranged at each of intersections between the plurality of write word lines and the plurality of bit lines. In the magnetoresistive element, a free layer is a laminated free layer, and a magnetization easy axis direction is a direction dislocated at about 45 degrees from the first direction.

In the toggle magnetic random access memory, the write operation to each of the plurality of memory cells is executed by a series of current controls, which supplies a first write current to a selected write word line selected from the plurality of write word lines, and then supplies a second write current to a selected bit line selected from the plurality of bit lines, and after that, stops the first write current and then stops the second write current.

In the toggle magnetic random access memory, the controller controls the first memory array and the second memory array such that the first burst write operation and the second burst write operation are not executed at the same time.

In the toggle magnetic random access memory, the controller controls the first memory array and the second memory array such that a second sensing operation is performed on a second memory cell targeted for the next second burst write operation among the plurality of second memory cells in the first state and such that a first sensing operation is performed on a first memory cell targeted for the next first burst write operation among the plurality of first memory cells in the second state.

In the toggle magnetic random access memory, the controller controls the first memory array and the second memory array such that the first sensing operation and second sensing operation and the first burst write operation and second burst write operation are executed synchronously with a clock signal inputted from outside.

In the toggle magnetic random access memory, the controller inserts a data, which indicates which of the first state and the second state is firstly executed, into an address signal and outputs the address signal to the first memory array and the second memory array.

In the toggle magnetic random access memory, the controller outputs a first address signal to the first memory array at the time of the first burst write operation and outputs a second address signal to the second memory array at the time of the second burst write operation. The first memory array selects a selected first cell from the plurality of first memory cells on the basis of the first address signal. The second memory array selects a selected second cell from the plurality of second memory cells on the basis of the second address signal. The first address signal and the second address signal are alternately changed at timings different from each other.

In the toggle magnetic random access memory, the controller controls the first memory array such that the first sensing operation is performed in advance for a first memory cell targeted for the next first burst write operation among the plurality of first memory cells, before the first burst write operation is started, and does not change the first address signal until the first burst write operation completion after the first sensing operation start. This controls the second memory array such that the second sensing operation is performed in advance for a second memory cell targeted for the next second burst write operation among the plurality of second memory cells, before the second burst write operation is started, and does not change the second address signal until the second burst write operation completion after the second sensing operation start.

In the toggle magnetic random access memory, the controller changes the first address signal when the first sensing operation is started, and changes the second address signal when the second sensing operation is started.

In the toggle magnetic random access memory, an address after the change of the second address signal is equal to an address of the first address signal at the time when the second address signal is changed.

In the toggle magnetic random access memory, the controller generates the first address signal and the second address signal on the basis of the address signal inputted from outside.

In the toggle magnetic random access memory, the controller generates a first read enable signal for controlling the first sensing operation and a second read enable signal for controlling the second sensing operation on the basis of the address signal and a command signal inputted from the outside.

In the toggle magnetic random access memory, the controller generates a first write enable signal for controlling the first burst write operation and a second write enable signal for controlling the second burst write operation on the basis of the address signal and the command signal.

In the toggle magnetic random access memory, the controller outputs the first write enable signal having a clock delay of at least one cycle with respect to the first read enable signal and outputs the second write enable signal having a clock delay of at least one cycle with respect to the second read enable signal.

In the toggle magnetic random access memory, the controller generates a row address signal for selecting rows in the first memory array and the second memory array, a first column address signal for selecting a column in the first memory array, and a second column address signal for selecting a column in the second memory array, for the address signal inputted from the outside.

In the toggle magnetic random access memory, the controller increases the first column address signal and the second column address signal, respectively, in synchronization with the clock signal.

In the toggle magnetic random access memory, the controller allocates least significant bits of the first column address signal and the second column address signal to the first memory array and the second memory array, respectively.

In the toggle magnetic random access memory, the controller inserts a data, which indicates which of the first memory array and the second memory array is firstly accessed, into the least significant bits of the first column address signal and the second column address signal in an initial states.

In the toggle magnetic random access memory, the controller outputs any one of the first read enable signal with regard to the first sensing operation of the first memory array and the second read enable signal with regard to the second sensing operation of the second memory array, on the basis of the least significant bits of the first column address signal and the second column address signal in an initial states.

In the toggle magnetic random access memory, in the controller, the first column address signal except the least significant bit is the first address signal, and the second column address signal except the least significant bit is the second address signal.

In the toggle magnetic random access memory, the controller generates a burst address signal for selecting the columns in the first memory array and the second memory array on the basis of the address signal inputted from the outside. The burst address signal is continuously increased for each cycle of the clock signal.

In the toggle magnetic random access memory, the controller increases a value, in which the burst address signal is defined as the lower-order bit and each of the first column address signal and the second column address signal is defined as a high-order bit, continuously for each cycle of the clock signal.

The toggle magnetic random access memory further includes a plurality of first sense amplifying circuits and a plurality of second sense amplifying circuits. The plurality of first sense amplifying circuits sense data of a plurality of selected first cells selected from the plurality of first memory cells by the row address signal and the first column address signal, when the first read enable signal is active. The plurality of second sense amplifying circuits sense data of a plurality of selected second cells selected from the plurality of second memory cells by the row address signal and the second column address signal, when the second read enable signal is active. Each of the plurality of first sense amplifying circuits and each of the plurality of second sense amplifying circuits are allocated to the burst address signal.

In the toggle magnetic random access memory, the plurality of first sense amplifying circuits are respectively operated at the same time, and the plurality of second sense amplifying circuits are respectively operated at the same time.

In the toggle magnetic random access memory, the controller inputs the burst address signal, which has the clock delay of at least one cycle with respect to the first column address signal and the second column address signal, to the first memory array and the second memory array, and each of the plurality of first sense amplifying circuits and each of the second sense amplifying circuits.

The toggle magnetic random access memory further includes: a plurality of first registers for temporally storing sensed results of the plurality of first sense amplifying circuits; and a plurality of second registers for temporally storing sensed results of the plurality of second sense amplifying circuits.

In the toggle magnetic random access memory, the plurality of first registers and the plurality of second registers output only the sensed results corresponding to the burst address signal.

In the toggle magnetic random access memory, the controller outputs control signals, which correspond to the least significant bits of the first column address signal and the second column address signal and have the same clock delay as the latency of the burst address signal. The toggle magnetic random access memory further includes a multiplexer for outputting any output signal of the plurality of first registers and the plurality of second registers on the basis of the control signals. The output signal of the multiplexer becomes a data output signal.

The toggle magnetic random access memory further includes a first write circuit and a second write circuit. The first write circuit supplies a first write current and a second write circuit to the first write word line and the plurality of first bit lines, respectively, of the plurality of selected first cells selected from the plurality of first memory cells on the basis of the row address signal, the first column address signal and the burst address signal, when the first write enable signal for controlling the first burst write operation is active. The second write circuit supplies a third write current and a fourth write circuit to the second write word line and the plurality of second bit lines, respectively, of the plurality of selection second cells selected from the plurality of second memory cells on the basis of the row address signal, the second column address signal and the burst address signal, when the second write enable signal for controlling the second burst write operation is active.

In the toggle magnetic random access memory, the first write circuit supplies the first write current ahead of the second write current and stops the first write current ahead of the second write current. The second write circuit supplies the third write current ahead of the fourth write current and stops the third write current ahead of the fourth write current.

In the toggle magnetic random access memory, the first write circuit includes a first determining circuit for comparing an output signal of each of the plurality of first registers and a data input signal inputted from outside. The first determining circuit supplies the first write current and the second write current when both are different and does not supply them when both are equal, on the basis of the comparison result. The second write circuit includes a second determining circuit for comparing an output signal of each of the plurality of second registers and a data input signal inputted from the outside. The second determining circuit supplies the third write current and the fourth write current when both are different, and does not supply them when both are equal, on the basis of the compared result.

The toggle magnetic random access memory further includes a plurality of third sense amplifying circuits that are operated when the first read enable signal and the second read enable signal are active. Each of the plurality of third sense amplifying circuits is allocated to the burst address signal.

The toggle magnetic random access memory further includes a plurality of third registers for temporally holding sensed results of the plurality of third sense amplifying circuits. The plurality of third registers outputs only a sensed result corresponding to the burst address signal, and the outputted sensed result is the data output signal.

The toggle magnetic random access memory further includes a selector, which connects inputs of the plurality of third sense amplifying circuits to the first memory array on the basis of the first read enable signal and connects it to the second memory array on the basis of the second read enable signal.

The toggle magnetic random access memory further includes a third write circuit and a third determining circuit. The third write circuit supplies the first write current and the second write current when the first read enable signal is active, and supplies the third write current and the fourth write current when the second read enable signal is active. The third determining circuit compares an output signal of each of the plurality of third registers and a data input signal inputted from the outside. The third write circuit supplies the first write current and second write current, or the third write current and fourth write current, when both are different, and does not supply them when both are equal, on the basis of the compared result.

The toggle magnetic random access memory further includes a selector for connecting the third write circuit to the first memory array on the basis of the first write enable signal and connecting to the second memory array on the basis of the second write enable signal.

In order to solve the above-mentioned problems, the write method of the toggle magnetic random access memory of the present invention includes: an (a) step of executing a first burst write operation in a first memory array through a toggle writing, at a continuous burst write mode; and a (b) step of executing a second burst write operation in a second memory array through the toggle writing. The (a) and (b) steps are repeated until a completion of the continuous burst write mode.

Here, the toggle magnetic random access memory includes the first memory array and the second memory array. The first memory array includes a plurality of first memory cells including magnetoresistive elements. The second memory array includes a plurality of second memory cells including magnetoresistive elements and differs from the first memory array in the write wiring used for writing. The magnetoresistive element is such that a free layer is the laminated free layer and such that a magnetization easy axis direction is a direction dislocated at about 45 degrees with respect to the write word line.

In the write method of the toggle magnetic random access memory, the step (a) includes a (a1) step of performing a first sensing operation for first memory cells targeted for the first burst write operation, among the plurality of first memory cells, prior to the first burst write operation. The step (b) includes a (b1) step of performing a second sensing operation for second memory cells targeted for the second burst write operation, among the plurality of second memory cells, prior to the second burst write operation.

According to the toggle MRAM of the present invention, the continuous burst write operation can be executed at the high speed without any drop in the reliability and any increase in the circuit area.

BRIEF DESCRIPTION OF THE DRAWINGS

FIG. 10A shows an example of an address allocation in the first embodiment of the toggle MRAM of the present invention.

FIG. 10B shows an example of an address allocation in the first embodiment of the toggle MRAM of the present invention.

FIG. 10C shows an example of an address allocation in the first embodiment of the toggle MRAM of the present invention.

FIG. 17 is a view showing a timing chart of a continuous burst write operation in the second embodiment of the toggle MRAM of the present invention.

BEST MODE FOR CARRYING OUT THE INVENTION

The toggle MRAM of the present invention and the write method of the toggle MRAM will be described below with reference to the attached drawings.

First Embodiment

At first, the configuration in the first embodiment of the toggle MRAM of the present invention will be explained.

Figure 1:
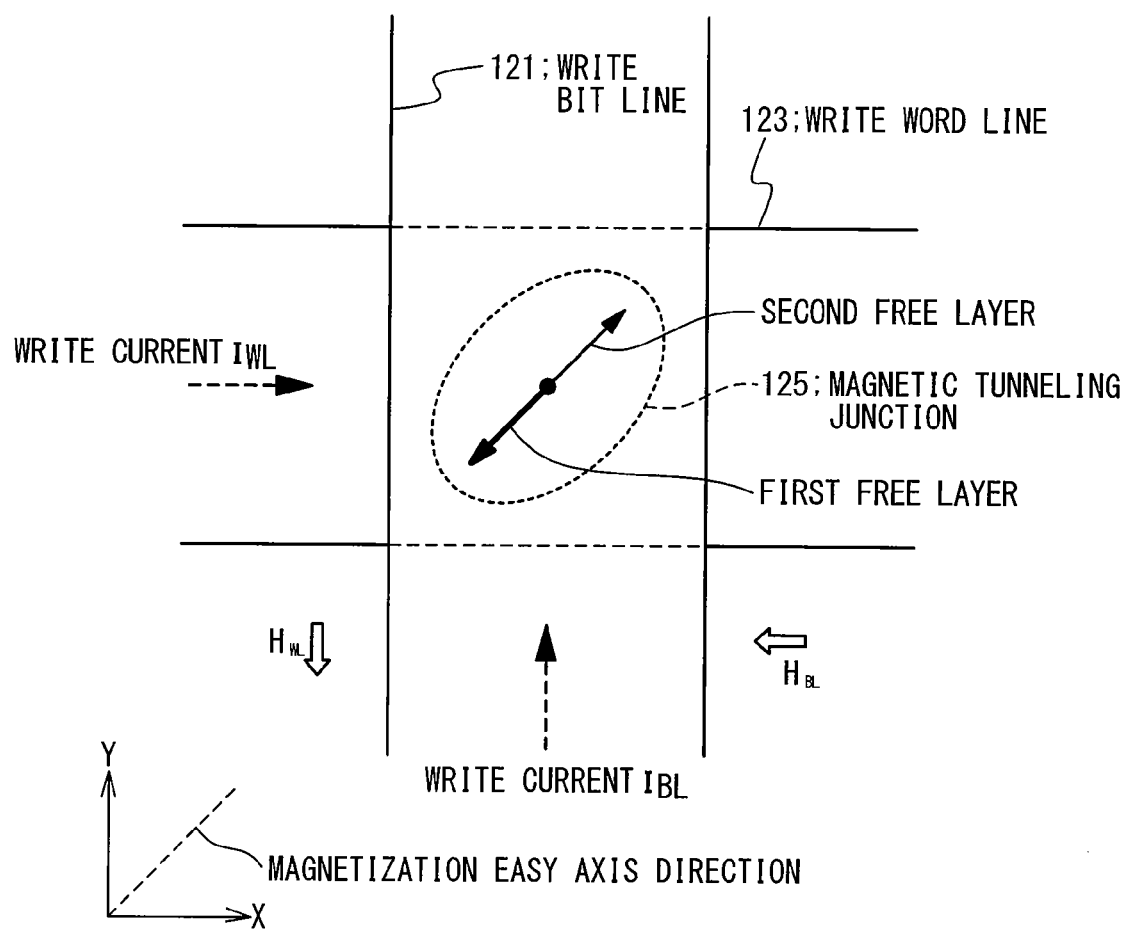
FIG. 1 shows a planar layout of the memory cell in a toggle MRAM described in U.S. Pat. No. 6,545,906.
Figure 2:
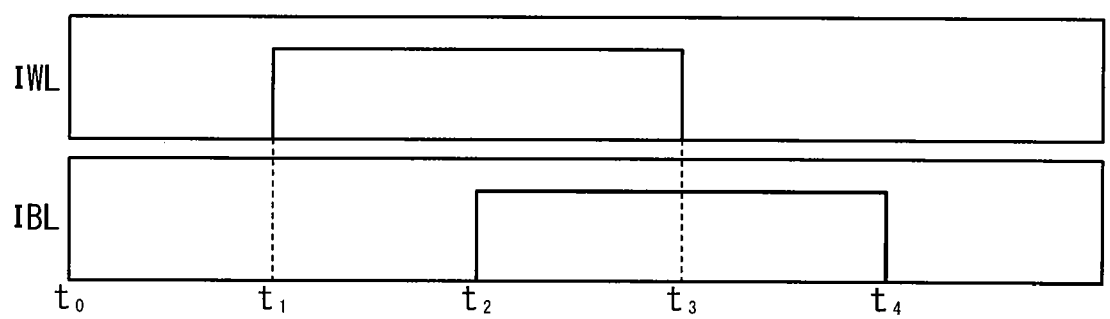
FIG. 2 is a view showing a toggle operation principle of a conventional toggle MRAM.
Figure 3:
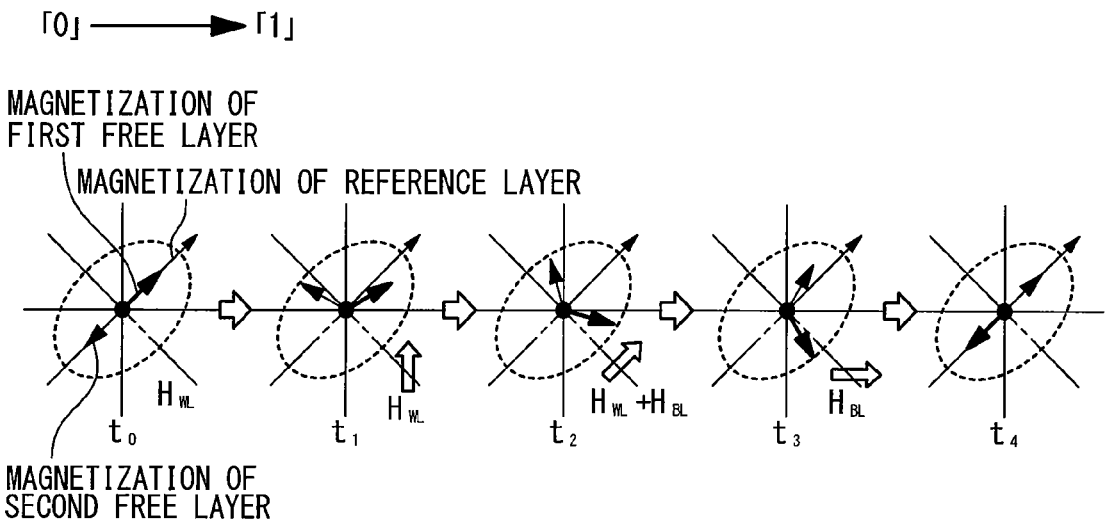
FIG. 3 is a view showing the toggle operation principle of the conventional toggle MRAM.
Figure 4:
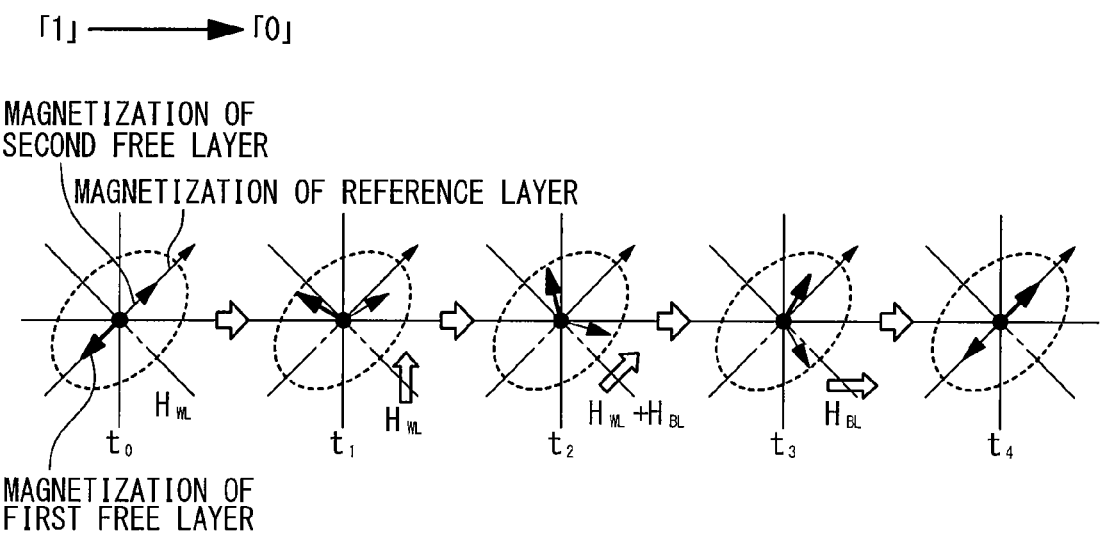
FIG. 4 is a view showing the toggle operation principle of the conventional toggle MRAM.
Figure 5:
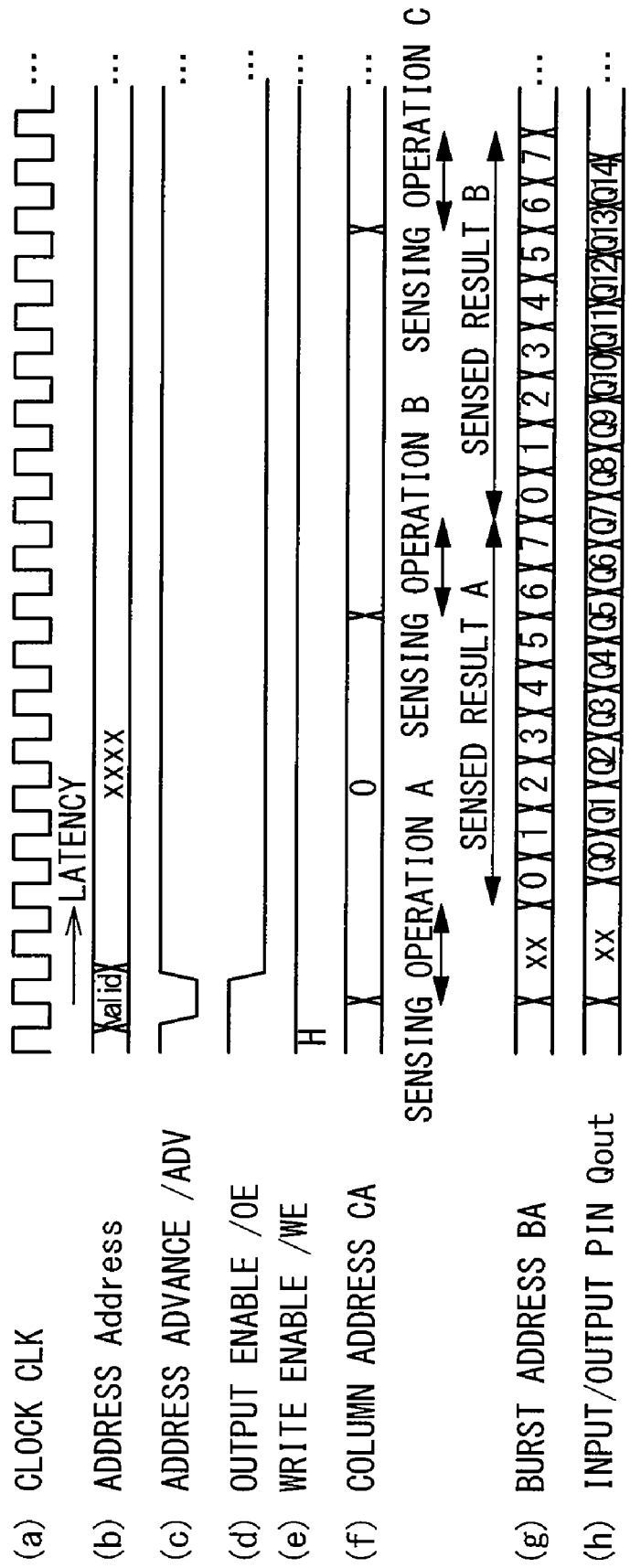
FIG. 5 is a view showing a timing chart of a continuous burst read operation.
Figure 6:
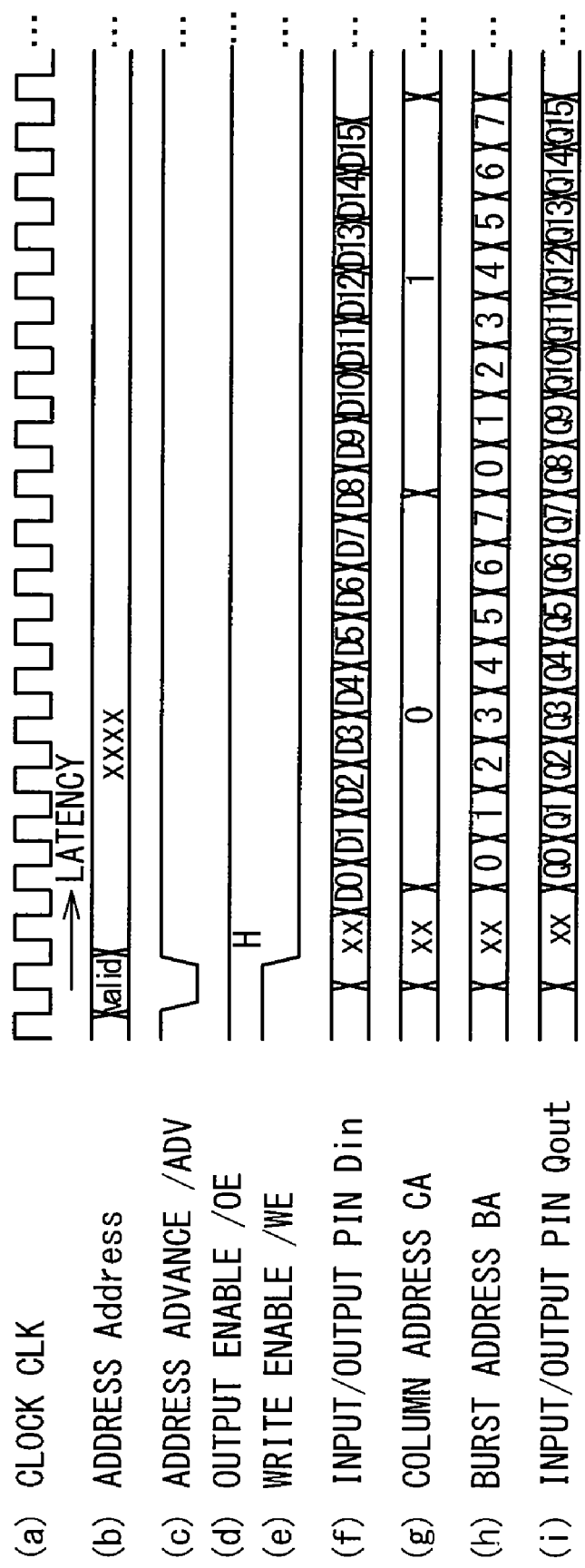
FIG. 6 is a view showing the timing chart of the continuous burst write operation.
Figure 7:
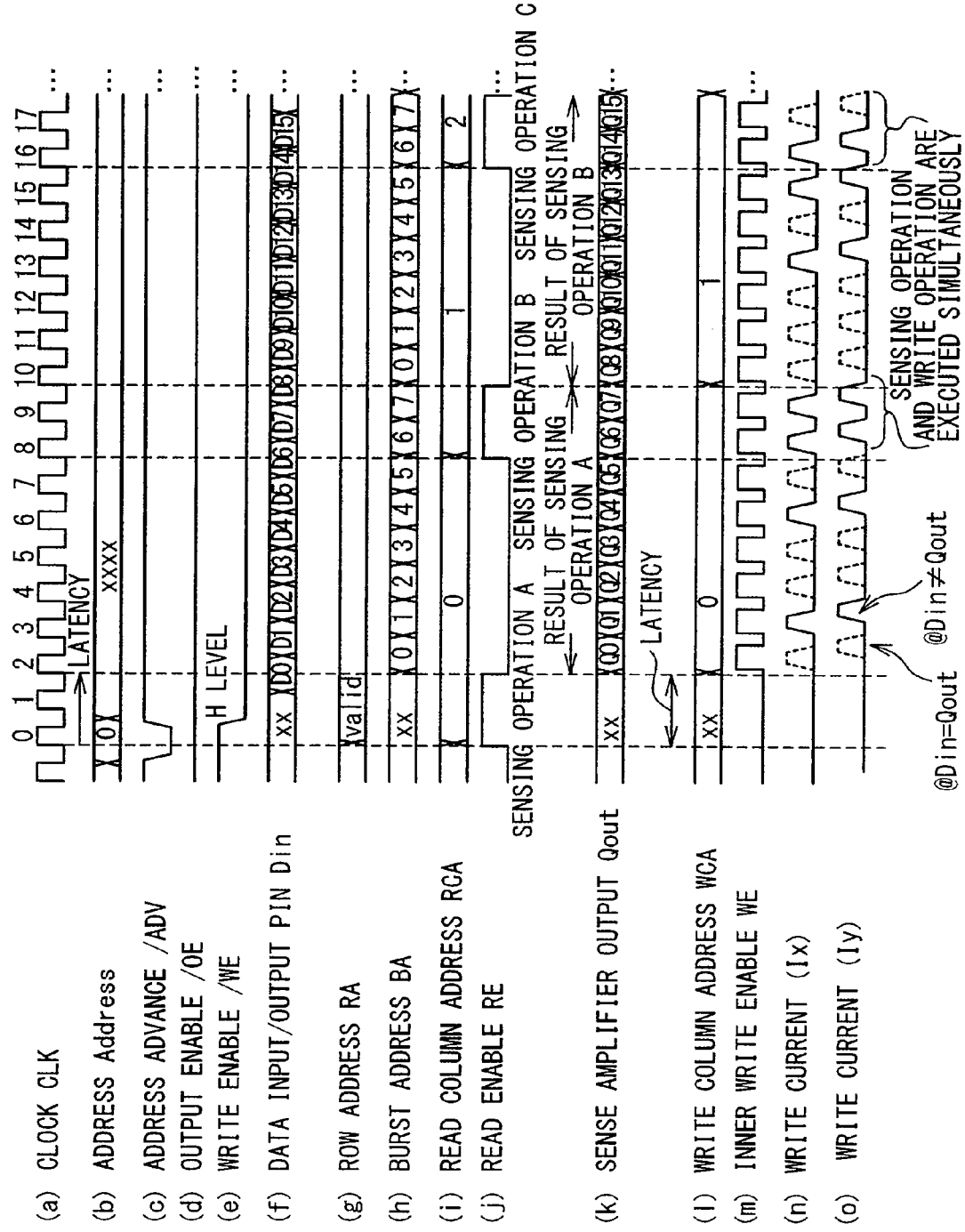
FIG. 7 is a view showing one example of a timing chart of a continuous burst write operation in the toggle MRAM.
Figure 8:
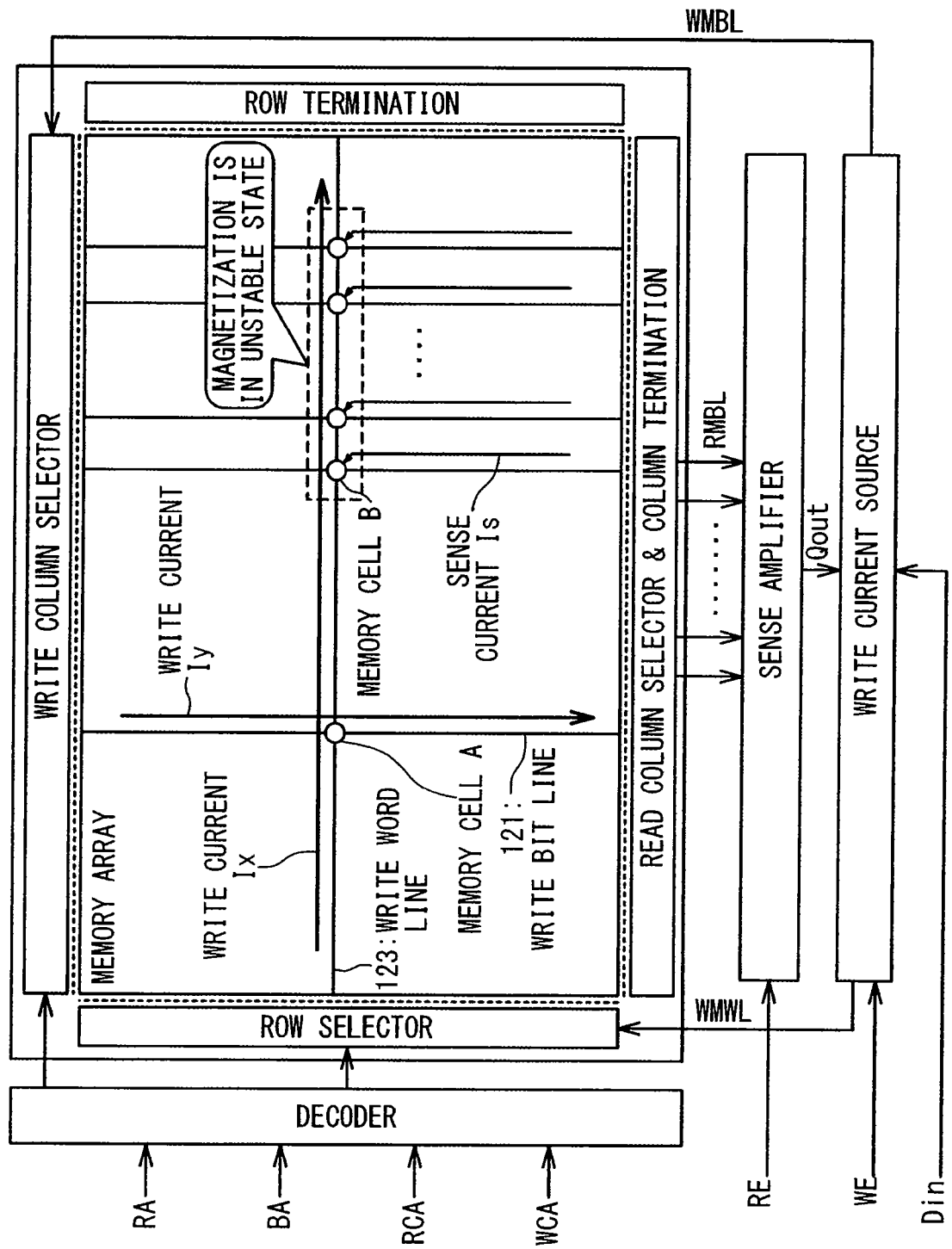
FIG. 8 is a view showing a state of a memory array at a ninth cycle of the CLK signal in FIG. 7.
Figure 9:
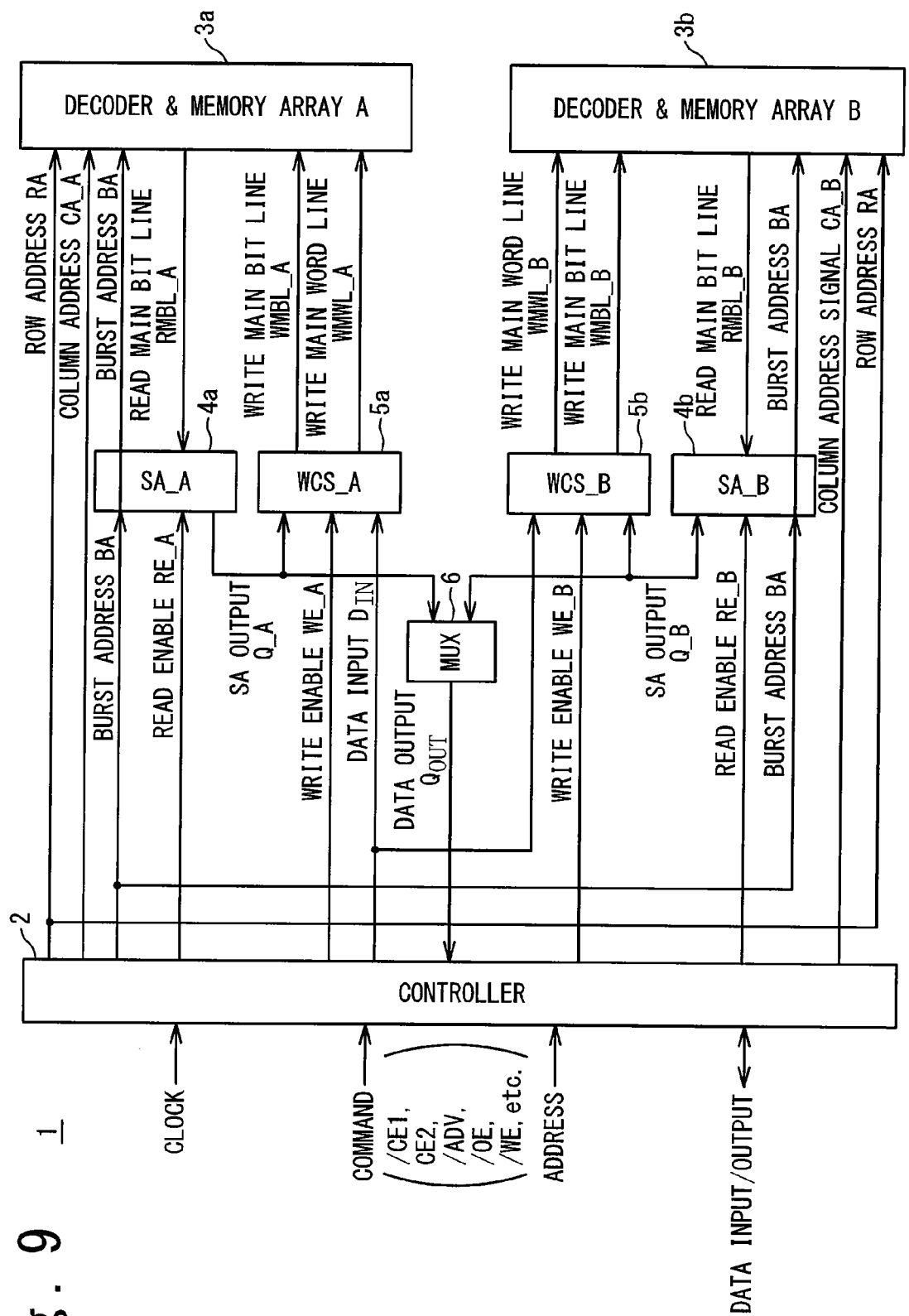
FIG. 9 is a block diagram showing a configuration in a first embodiment of a toggle MRAM of the present invention.

FIG. 9 is a block diagram showing a configuration in the first embodiment of the toggle MRAM of the present invention. A toggle MRAM 1 includes a controller 2, a decoder & memory array A 3a, a decoder & memory array B 3b, a sense amplifier A 4a, a sense amplifier B 4b, a write circuit A 5a, a write circuit B 5b, a multiplexer 6.

The decoder & memory array A 3a includes a memory array A 36a having a plurality of memory cells 39a that are arranged in a matrix shape. The decoder & memory array B 3b includes the memory array A 36a having a plurality of memory cells 39b that are arranged in a matrix shape. Write word lines 37W and bit lines 38 of the memory array A 36a are physically separated from those of the memory array B 36b. Its detail will be described later.

The controller 2 controls the decoder & memory array A 3a and the decoder & memory array B 3b such that a first state in which a first burst write operation in the decoder & memory array A 3a is carried out and a second state in which a second burst write operation in the decoder & memory array B 3b is carried out are alternately executed in a continuous burst write mode. The controller 2 outputs a row address signal RA, a column address signal CA, a burst address signal BA on the basis of an address signal inputted from outside with respect to the above control. The row address signal RA and the burst address signal BA are inputted to both of a memory array A and a memory array B. Here, the column address signal CA has two systems of a column address signal CA_A inputted to the memory array A and a column address signal CA_B inputted to the memory array B.

FIGS. 10A to 10C show examples of an address allocation in the first embodiment of the toggle MRAM of the present invention.

Here, (a) shows an example of an address allocation, (b) is a view showing an example of a physical allocation of a column address in the memory array A, and (c) is a view showing an example of a physical allocation of a column address in the memory array B.

In the (a), the controller 2 automatically increments only a burst address BA[b:0], at the time of the usual burst operation. At the time of the continuous burst operation, the controller 2 automatically increments the burst address BA[b:0] as a low order bit and a column address CA[y:0] as a high order bit. Here, a least significant bit CA[0] of the column address CA[y:0] is allocated for a selection of the memory array A 36a and the memory array B 36b. In short, at the time of the continuous burst operation, the memory array A 36a and the memory array B 36b are alternately accessed.

As shown in the (b), a case of CA[0]=0 indicates that this is an address of the memory array A 36a. In that case, CA[y:1]=0 indicates the address of 0 in the memory array A 36a. Here, CA=0 indicates this is an address of a set of the memory array A 36a and the memory array B 36b. Thus, in a case of the column address CA[y:0]=00, the continuous burst operation is performed on the plurality of memory cells located at the address of 0 in the memory array A 36a. CA[y:1]=1 indicates the address of 1 in the memory array A 36a (indicates the CA=2 of the set). Thus, in a case of a column address CA[y:0]=10, the continuous burst operation is performed on the plurality of memory cells located at the address of 2 the memory array A 36a. Hereafter, the operations are similarly executed. Here, the addresses of the memory array A 36a are assumed to be only the even numbers.

As shown in (c), a case of CA[0]=1 indicates that this is an address of the memory array B 36b. In that case, CA[y:1]=0 indicates the address of 0 in the memory array B 36b (indicates the CA=1 of the set). Thus, in the case of the column address CA[y:0]=01, the continuous burst operation is performed on the plurality of memory cells located at the address of 0 in the memory array B 36b. CA[y:1]=1 indicates the address of 1 in the memory array B 36b (indicates the CA=3 of the set). Hence, in a case of a column address CA[y:0]=11, the continuous burst operation is performed on the plurality of memory cells located at the address of 1 in the memory array B 36b. Hereafter, the operations are similarly executed. Here, the addresses of the memory array B 36b are assumed to be only the odd numbers.

With reference to FIG. 9, the sense amplifier A (SA_A) 4a includes a plurality of sense amplifiers 41 (which will be described later) for sensing the plurality of memory cells in the memory array A 36a, respectively. The sense amplifier A 4a receives a read enable signal RE_A for operating the sense amplifier A 4a through the controller 2. Then, the sense amplifier A 4a senses data in the plurality of memory cells in the memory array A 36a that is selected by the row address signal RA and the column address signal CA_A.

The sense amplifier B (SA_B) 4b includes a plurality of sense amplifiers 41 (which will be described later) for sensing the plurality of memory cells in the memory array B 36b, respectively. The sense amplifier B 4b receives a read enable signal RE_B for operating the sense amplifier B 4b through the controller 2. Then, the sense amplifier B 4b senses data of the plurality of memory cells in the memory array B 36b that is selected by the row address signal RA and the column address signal CA_B.

The multiplexer 6 receives an output signal Q_A of the sense amplifier A 4a and an output signal Q_B of the sense amplifier B 4b. Then, the multiplexer 6 outputs any one of the sensed result of the memory cell 39a in the memory array A4a and the sensed result of the memory cell 39b in the memory array B4b to the controller 2 as a data output signal Qout.

The write circuit A (WCS_A) 5a carries out the write operation to the memory cell 39a in the memory array A36a. That is, the write circuit A 5a supplies the write currents Ix, Iy to the write word line 37Wa and the bit line 38a, respectively, in the memory cell 39a in the memory array A 36a that is selected by the row address signal RA, the column address signal CA_A and the burst address signal BA.

The write circuit B (WCS_B) 5b carries out the write operation to the memory cell 39b in the memory array B36b. The write circuit B 5b supplies the write currents Ix, Iy to the write word line 37Wb and the bit line 38b, respectively, in the memory cell 39b in the memory array B 36b that is selected by the row address signal RA, the column address signal CA_B and the burst address signal BA.

Also, the write enable signal WE signal has the write enable signal of the two systems, which is composed of a write enable signal WE_A for operating the write circuit A 5a and a write enable signal WE_B for operating the write circuit B5b.

Figure 11:
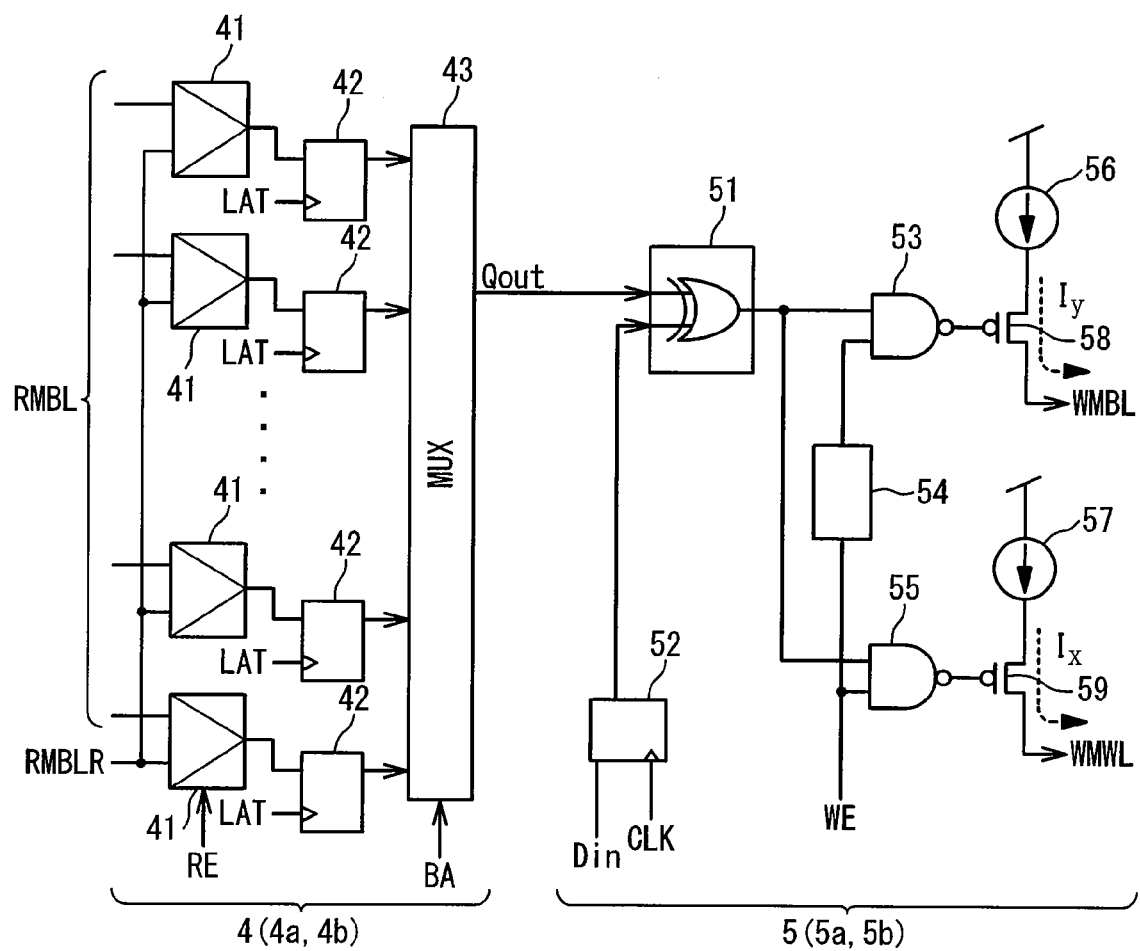
FIG. 11 is a block diagram showing one example of configurations of a sense amplifier and a write circuit in the first embodiment of the toggle MRAM of the present invention.

FIG. 11 is a block diagram showing an example of the configuration of the sense amplifier and the write circuit in the first embodiment of the toggle MRAM of the present invention. The sense amplifier 4 (4a, 4b) includes a plurality of sense amplifiers 41 and a plurality of registers 42 and a multiplexer 43. Each of the plurality of registers 42 corresponds to any of the plurality of sense amplifiers 41 and is installed at the later stage thereof. Each of the plurality of registers 42 temporally stores the sensed result. Also, each of the plurality of sense amplifiers 41 and each of the plurality of registers 42 are allocated to the burst address BA. The multiplexer 43 outputs the sensed result from the register 42 corresponding to the burst address BA as the output signal Qout.

When the read enable signal RE is activated, the sensing operation begins to be performed on all of the plurality of memory cells 39 selected on the basis of a row address RA and a column address CA. Each of the plurality of sense amplifiers 41 senses the corresponding memory cell 39 and outputs the sensed result to the corresponding register 42. The register 42 stores the sensed result in response to a latch signal LAT. The multiplexer 43 receives the sensed result corresponding to the burst address BA from the register 42 and outputs as the output signal Qout of the sense amplifier 4.

The write circuit 5 (5a, 5b) includes a toggle operation determining circuit 51, a register 52, NAND circuits 53, 55, a delaying circuit 64, current source circuits 56, 57, and write enabling switches 58, 59. The write enabling switches 58, 59 are turned on or off by the write enable signal WE signal. The current source circuit 57 is connected to a row selector 33 (which will be described later) when the write enabling switch 59 is on. Then, the write current Ix is supplied to the write word line 37W in the selection state selected by the row selector 33. The current source circuit 56 is connected to a row selector 32 (which will be described later) when the write enabling switch 58 is on. Then, the write current Iy is supplied to the bit line 38 in the selection state selected by the write column selector 32 (which will be described later). The toggle determining circuit 51 compares the sensed result (Qout) of the memory cell 39 in the selection state and the data input signal (Din) inputted through the register 52. If both are different as the result of the comparison, the write current Iy is supplied to the bit line 38 selected by the write column selector 32, and the write current Ix is supplied to the write word line 37W selected by the row selector 33. That is, the toggle operation is executed. If the sensed result (Qout) and the data input signal (Din) are equal, the write currents Ix, Iy are not supplied. The foregoing determination is the operation peculiar to the toggle MRAM and can be easily attained by using an exclusive OR gate. In this circuit example, if the toggle operation is determined to be executed, since the write enable signal WE sent to the current source circuit 56 is passed through the delaying circuit, the write current Ix can be supplied ahead of the write current Iy and can be stopped ahead of it.

Figure 14:
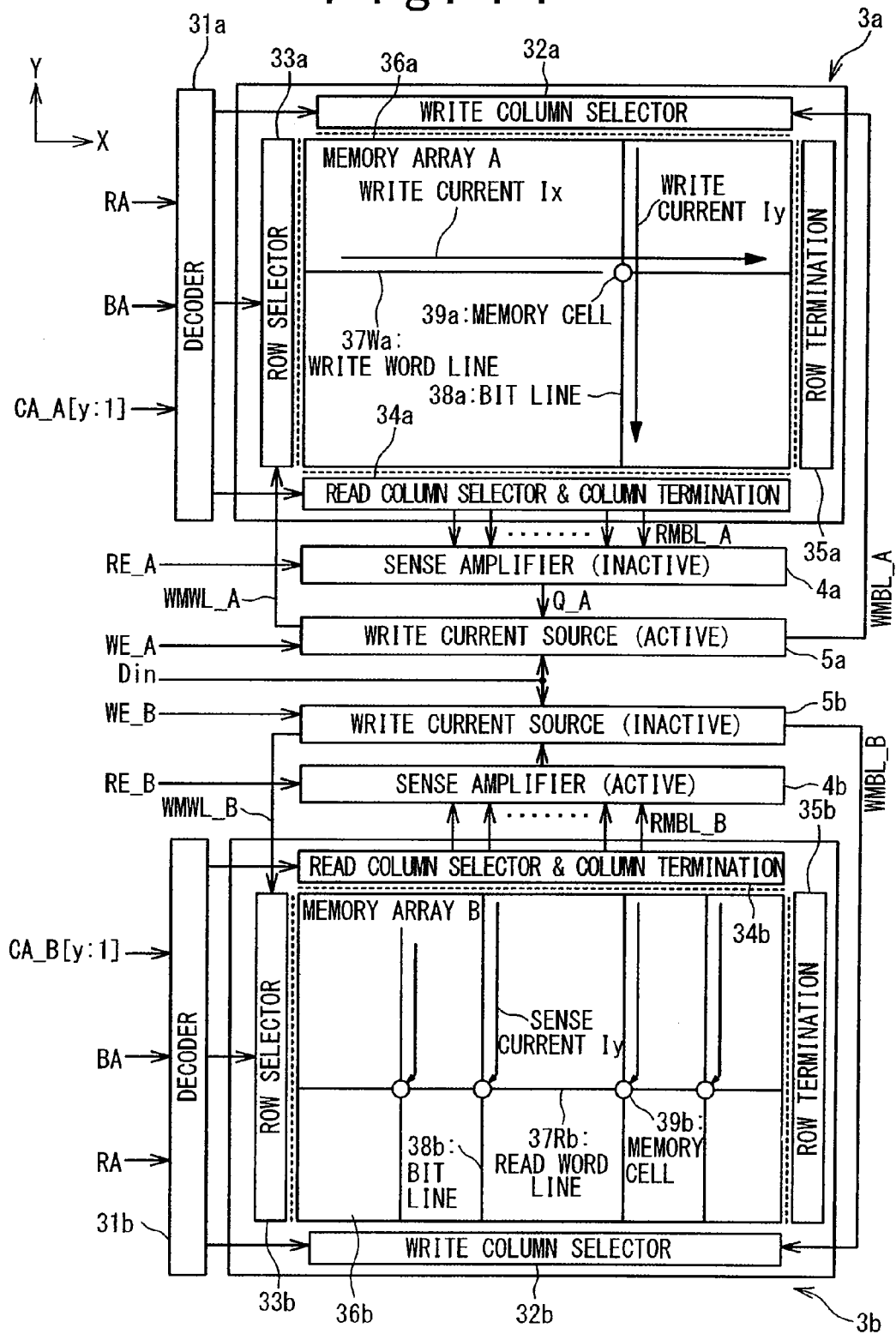
FIG. 14 is a block diagram showing a partial configuration in the first embodiment of the toggle MRAM of the present invention.

FIG. 14 is a block diagram showing a partial configuration in the first embodiment of the toggle MRAM of the present invention.

The decoder & memory array A 3a includes a decoder 31a, a write column selector 32a, a row selector 33a, a read column selector & column termination circuit 34a, a row termination circuit 35a and the memory array A 36a. The memory array A 36a includes a plurality of write word lines 37Wa extending in an X-direction, a plurality of (write) bit lines 38a extending in a Y-direction, and a plurality of memory cells A 39a installed correspondingly to the respective intersections of the plurality of write word lines 37Wa and the plurality of bit lines 38a. Incidentally, the memory array A 36a may include all of the components of the decoder & memory array A 3a.

The decoder & memory array B 3b includes a decoder 31b, a write column selector 32b, a row selector 33b, a read column selector & column termination circuit 34b, a row termination circuit 35b and the memory array B 36b. The memory array B 36b includes a plurality of write word lines 37Wb extending in the X-direction, a plurality of (write) bit lines 38b extending in the Y-direction, and a plurality of memory cells B 39b installed correspondingly to the respective intersections of the plurality of write word lines 37W band the plurality of bit lines 38b. Incidentally, the memory array B 36b may include all of the components of the decoder & memory array B 3b.

The decoder 31(a, b) outputs the column address to the write column selector 32 (a, b) and the read column selector & column termination circuit 34 (a, b) and the row address to the row selector 33 (a, b), respectively, at the time of the write operation, on the basis of the RA signal, the BA signal and the CA signal. Also, at the time of the sensing operation, the decoder 31(a, b) outputs the column address to the read column selector & column termination circuit 34(a, b) and the row address to the row selector 33(a, b), respectively. The write column selector 32(a, b) selects the selected bit line from the plurality of bit lines 38(a, b) at the time of the write operation, on the basis of the column address. The row selector 33(a, b) selects the selected write word line from the plurality of write word lines 37W(a, b) at the time of the write operation, on the basis of the row address, and selects a selected read word line from a plurality of read word lines 37R(a, b) (not shown) at the time of the sensing operation. The read column selector & column termination circuit 34(a, b) selects the selected bit line from the plurality of bit lines 38(a, b) at the time of the sensing operation, on the basis of the column address. Also, at the time of the write operation, the read column selector & column termination circuit 34(a, b) terminates the bit line 38. The row termination circuit 35a terminates the write word line 37W and the read word line 37R. The memory cell A 39a and the memory cell B 39b include MTJs as magnetoresistive elements, in each of which the free layer is the laminated free layer and the magnetization easy axis direction is the direction dislocated at about 45 degrees with respect to the X-direction. This MTJ is the MTJ used in the toggle MRAM. As that structure, it is possible to use the same structure as the conventional structure (example: the patent document 1). To the memory cell A 39a and the memory cell B 39b, a write operation is executed by the toggle operation (example: the patent document 1).

This view shows the situation that the burst write operation in the memory array A 36a and the sensing operation in the memory array B 36b are carried out at the same time. At this time, since the write current is not supplied to the memory array B 36b, the magnetization state of the memory array B 36b is stable, thereby enabling the accurate sensing operation.

The burst write operation in the first embodiment of the toggle MRAM of the present invention will be described below.

Figure 12:
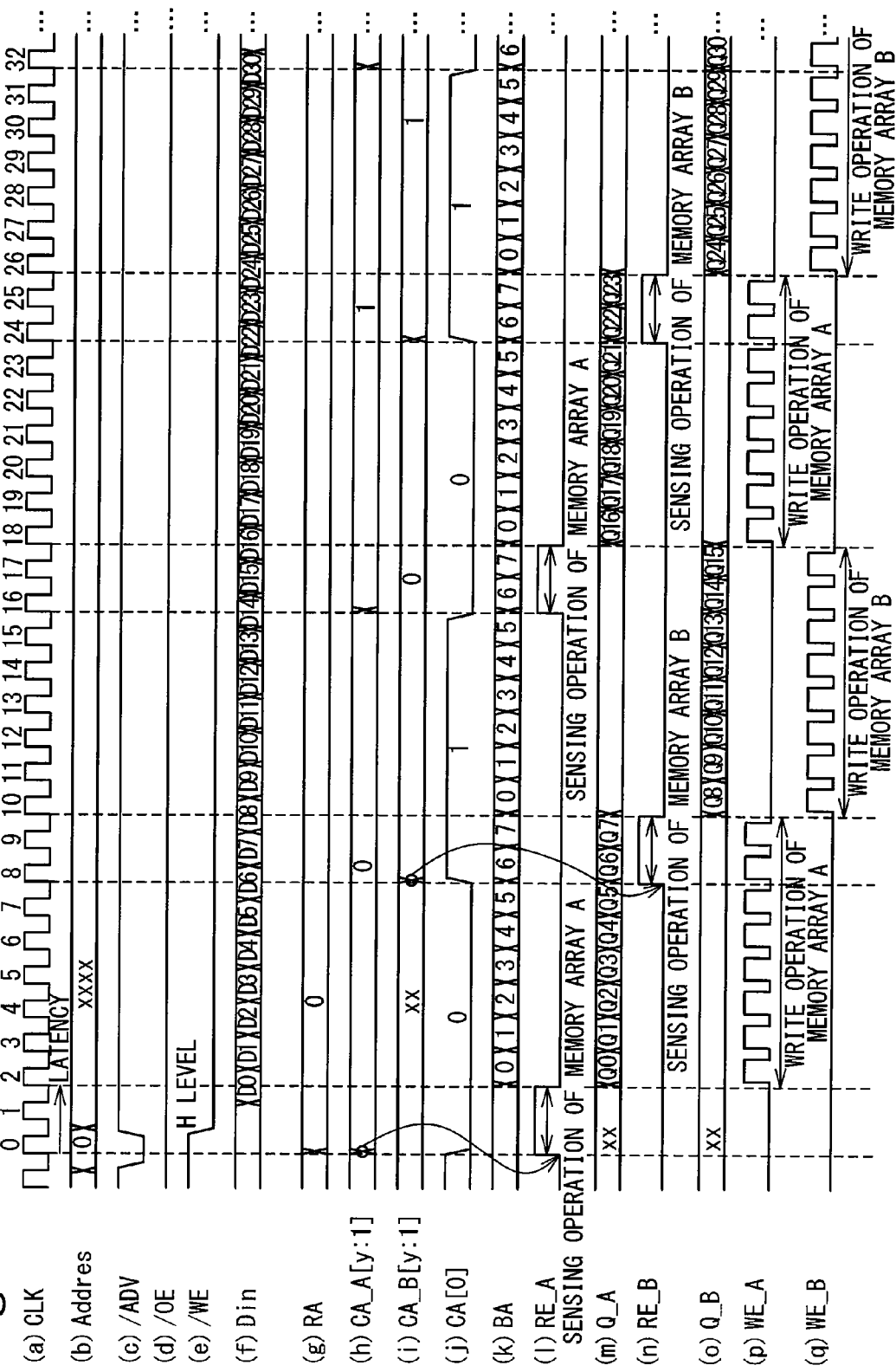
FIG. 12 is a view showing one example of a timing chart of a continuous burst write operation in the first embodiment of the toggle MRAM of the present invention.

FIG. 12 is a view showing an example of a timing chart of the continuous burst write operation in the first embodiment of the toggle MRAM of the present invention. Here, (a) shows the clock signal CLK, (b) shows the address signal Address, (c) shows the address/advance signal /ADV, (d) shows the output enable signal /OE, (e) shows the write enable signal /WE, (f) shows the signal Din inputted/outputted through the input/output pins, (g) shows the row address signal RA, (h) shows the column address signal CA_A[y:1] of the decoder & memory array A 3a, (i) shows the column address signal CA_B[y:1] of the decoder & memory array B 3b, (j) shows the column address signal CA_B[0], (k) shows the burst address signal BA, (l) shows the read enable signal RE_A of the decoder & memory array A 3a, (m) shows the output signal Q_A of the sense amplifier A 4a, (n) shows the read enable signal RE_B of the decoder & memory array B 3b, (o) shows the output signal Q_B of the sense amplifier B 4b, (p) shows an inner write enable signal WE_A of the decoder & memory array A 3a, and (q) shows an inner write enable signal WE_B of the decoder & memory array B 3b, respectively.

In this embodiment, for convenience, the burst length=8 bits, namely, the burst address signal of 3 bits is assumed. In this case, the eight sense amplifiers A 4a and the eight sense amplifiers B 4b are prepared. Also, the latency=2 is assumed.

At a 0th cycle, the ADV signal (c) becomes at a Low level, and the external address signal (b) is supplied into a chip. Here, the address=0 is supplied. That is, the timing chart in the case of a start address=0 is indicated in the example shown in FIG. 12. Also, until a next cycle, the external/WE signal (e) becomes at the Low level and enters into a write mode. At this time, since the latency=2, the data Din (f) that is written from outside is supplied for each cycle from the 2nd cycle.

As for the address signal (b) of the external input and the row address signal RA=0 that is generated when the address is obtained (the 0th cycle), a constant value is outputted until the completion of this operation. Also, the address signal in which the column address signal CA[y:1] ((h) or (i)) is defined as the high order bit and the burst address signal BA(k) is defined as the low order bit is sequentially incremented from the address of 0 for each clock cycle. Here, the burst address signal BA(k) is outputted behind the column address signal CA ((h) or (i)). That is, since the latency=2, the burst address signal BA (k) is outputted from the 2nd cycle. Also, the least significant bit CA[0] (j) of the column address CA when the address is obtained is 0, and the memory array A 36a is accessed ahead. Here, the column address signal CA_A[y:1] (h) except the least significant bit and inputted to the memory array A 36a is incremented at the time of the sensing operation start of the memory array A 36a. In the example shown in FIG. 12, from the 0th to 15th cycles, the address of 0 is outputted, and from the 16th to 31st cycles, the address of 1 is outputted. On the other hand, the column address signal CA_B[y:1] (i) except the least significant bit and inputted to the memory array B 36b is incremented at the time of the sensing operation start of the memory array B 36b. In the example shown in FIG. 12, from the 0th to 7th cycles are arbitrary (invalid), and from the 8th to 23rd cycles, the address of 0 is outputted, and from the 24th to 29th cycles, the address of 1 is outputted. Specifically, the CA_B signal is equal to the signal that the CA_A signal is latched at the rising edge of the RE_B signal.

In FIG. 12 in which the start address=0, the memory array A 36a is accessed ahead. For this reason, the RE_A signal (l) outputs the active state ahead of the RE_B signal (n). That is, from the 0th to 1st cycles and from the 16th and 17th cycles, the RE_A signal (l) becomes at a High level, and the sensing operation for the memory array A 36a is executed. Also, from the 8th to 9th cycles and from the 24th and 25th cycles, the RE_B signal (n) becomes at a High level, and the sensing operation for the memory array B 36n is executed. Similarly, the WE_A signal (p) outputs the active state ahead of the WE_B signal (q). That is, from the 2nd and 9th cycles and from the 18th and 25th cycles, the WE_A signal (p) becomes at the High level, and the burst write operation for the memory array A 36a is executed. Also, From the 10th and 17th cycles and from the 26th and 33rd cycles, the WE_B signal (q) becomes at the High level, and the burst write operation for the memory array B 36b is executed.

This operation will be described below for each cycle by using the timing chart shown in FIG. 12.

(1) From 0th to 1st Cycles

The RE_A signal (l) becomes active, and the sensing operation for the memory cell A 39a of the RA=0 and CA_A=0 (h) in the memory array A 36a is executed. At this time, the memory array B 36b is not accessed.

(2) From 2nd to 9th Cycles

The WE_A signal (p) becomes active, and the burst write operation for the memory cell A 39a of the RA=0, CA_A=0 (h) in the memory array A 36a is executed. At this time, the sensed results Q0 to Q7 (m) of the memory cells A 39a corresponding to the burst addresses are sequentially outputted, respectively, for the respective cycles. It is determined whether or not the toggle operation is executed, by comparing those sensed results Q0 to Q7 (m) with the external data input signals D0 to D7 (f), respectively. Here, from the 2nd to 7th cycles, the memory array B 36b is not accessed. However, from the 8th and 9th cycles, the RE_B signal (n) becomes active, and the sensing operation for the memory cell B 39b of the RA=0, CA_B=0 (i) in the memory array B 36b is executed.

That is, these 8th and 9th cycles are in the situation in which as shown in FIG. 14, the burst write operation in the memory array A 36a and the sensing operation in the memory array B 36b are executed at the same time. At this time, since the write current is not supplied to the memory array B 36b, the magnetization state of the memory cell B 39b is stable, which enables the accurate sensing operation.

(3) From 10th to 17th Cycles

The WE_B signal (q) becomes active, and the burst write operation for the memory cell B 39b of the RA=0, CA_B=0 (i) in the memory array B 36b is executed. At this time, the sensed results Q8 to Q15 (o) of the memory cells B 39b corresponding to the burst addresses are sequentially outputted, respectively, for the respective cycles. It is determined whether or not the toggle operation is executed, by comparing those sensed results Q8 to Q15 (o) with the external data input signals D8 to D15(f), respectively. Here, from the 10th to 15th cycles, the memory array A 36a is not accessed. However, from the 16th to 17th cycles, the RE_A signal (l) becomes active, and the sensing operation for the memory cell A 39a of the RA=0, CA_A=1 (h) in the memory array A 36a is executed. These 16th and 17th cycles are in the situation in which the burst write operation in the memory array B 36b and the sensing operation in the memory array A36a are executed at the same time. At this time, since the write current is not supplied to the memory array A 36a, the magnetization state of the memory cell A39a is stable, which enables the accurate sensing operation.

(4) From 18th to 25th Cycles

The burst write operation of the memory cell A 39a of the RA=0, CA_A=1 (h) in the memory array A36a is executed. From the 24th to 25th cycles, in addition to the foregoing operations, the sensing operation for the memory cell B 39b of the RA=0, CA_B=1 (i) in the memory array B 36b is executed.

(5) From 26Th to 33Rd Cycles

The burst write operation for the memory cell B 39b of the RA=0, CA_B=1 (i) in the memory array B 36b is executed. From the 32nd to 33rd cycles, in addition to the foregoing operations, the sensing operation for the memory cell A 39a of the RA=0, CA_A=2 (h) in the memory array A 36a is executed.

Since the foregoing operations are repeatedly executed until the final address of the column address CA, the continuous burst write operation can be executed without any erroneous operation.

Figure 13:
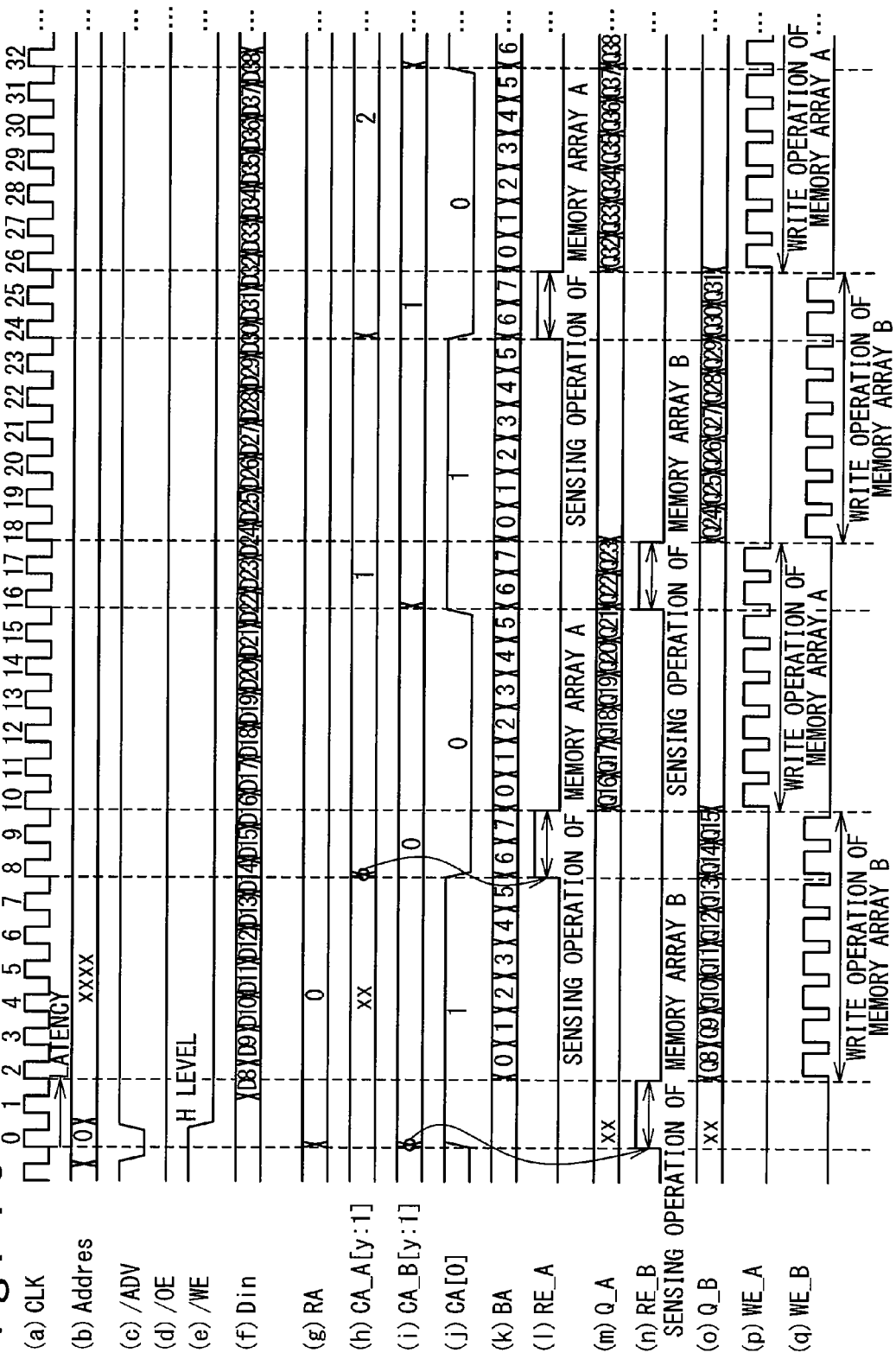
FIG. 13 is a view showing another example of a timing chart of the continuous burst write operation in the first embodiment of the toggle MRAM of the present invention.

FIG. 13 is a view showing another example of the timing chart of the continuous burst write operation in the first embodiment of the toggle MRAM of the present invention. Here, the start address=8. That is, from FIG. 12, it is a different point that the least significant bit CA[0] (j) of the column address when the address is obtained is 1 and thus the memory array B 36b is accessed ahead. In short, the RE_B signal (n)

outputs the active state ahead of the RE_A signal (l). The WE_B signal (q) outputs the active state ahead of the WE_A signal (p).

This operation will be described below for each cycle by using the timing chart shown in FIG. 13.

(1) From 0Th to 1St Cycles

The sensing operation for the memory cell B 39*b* of the RA=0 and CA_B=0 (i) in the memory array B3 6*b* is executed. At this time, the memory array A 36*a* is not accessed.

(2) From 2nd to 9th Cycles

The burst write operation for the memory cell B 39*b* of the RA=0, CA_B=0 (i) in the memory array B 36*b* is executed. At this time, the sensed results Q8 to Q15 (*o*) of the memory cells B 39*b* corresponding to the burst addresses are sequentially outputted, respectively, for the respective cycles. It is determined whether or not the toggle operation is executed, by comparing those sensed results Q8 to Q15 (*o*) with the external data input signals D8 to D15 (*f*), respectively. Here, from the 8th to 9th cycles, in addition to the foregoing operations, the sensing operation for the memory cell A 39*a* of the RA=0, CA_A=1 (h) in the memory array A 36*a* is executed.

(3) From 10th and 17th Cycles

The burst write operation for the memory cell A 39*a* of the RA=0, CA_A=1 (h) in the memory array A 36*a* is executed. At this time, the sensed results Q16 to Q23 (*n*) of the memory cells A 39*a* corresponding to the burst addresses are sequentially outputted, respectively, for the respective cycles. It is determined whether or not the toggle operation is executed, by comparing those sensed results Q16 to Q23 (*n*) with the external data input signals D16 to D23 (*f*), respectively. Also, from the 16th and 17th cycles, in addition to the foregoing operations, the sensing operation for the memory cell B 39*b* of the RA=0, CA_B=1 (i) in the memory array B 36*b* is executed.

(4) From 18th to 25th Cycles

The burst write operation for the memory cell B 39*b* of the RA=0, CA_B=1 (i) in the memory array B 36*b* is executed. From the 24th to 25th cycles, in addition to the foregoing operations, the sensing operation for the memory cell A 39*a* of the RA=0, CA_A=2 (h) in the memory array A 36*a* is executed.

(5) From 26th to 33rd Cycles

The burst write operation for the memory cell A 39*a* of the RA=0, CA_A=2 (h) in the memory array A 36*a* is executed. From the 32nd to 33rd cycles, in addition to the foregoing operations, the sensing operation for the memory cell A 39*b* of the RA=0, CA_B=2 (i) in the memory array B36*b* is executed.

Since the foregoing operations are repeatedly executed until the final address of the column address, the continuous burst write operation can be surely executed without any erroneous operation.

Even in the other operational modes, namely, the continuous burst read operation and the usual burst write/read operation, it can be operated without any change and addition of the circuit configuration.

According to the present invention, it can be attained without any drop in the reliability of the write operation and without any increase in the circuit area while the continuous burst write operation is made faster.

Second Embodiment

The configuration in the second embodiment of the toggle MRAM of the present invention will be described below.

Figure 15:
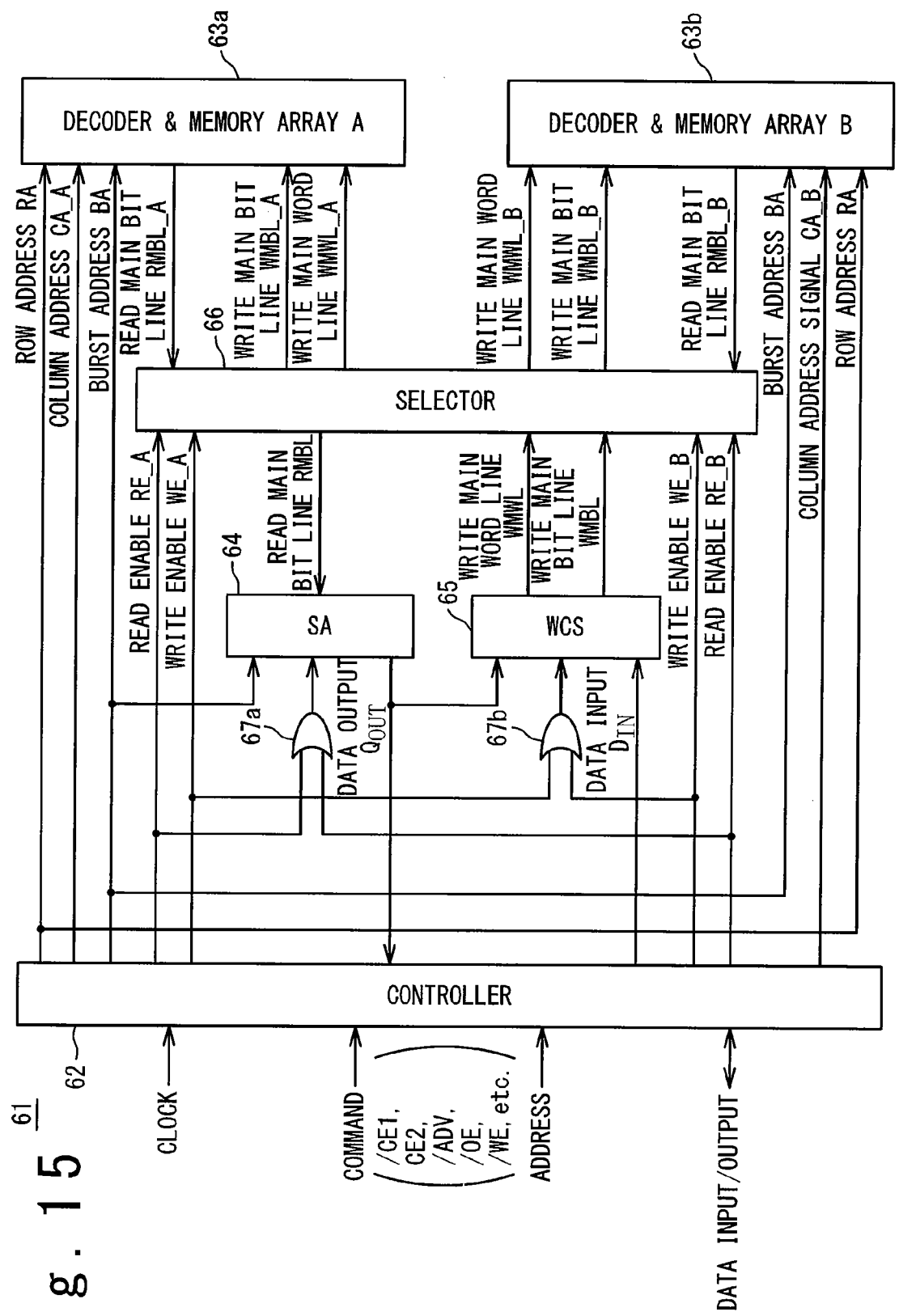
FIG. 15 is a block diagram showing a configuration in a second embodiment of the toggle MRAM of the present invention.

FIG. 15 is a block diagram showing a configuration in the second embodiment of the toggle MRAM of the present invention. A toggle MRAM 61 includes a controller 62, a decoder & memory array A 63*a*, a decoder & memory array B 63*b*, a sense amplifier 64, a write circuit 65, a selector 66 and OR circuits 67*a*, 67*b*.

The points that the memory array is divided into the memory array A and the memory array B in which the write wirings are physically separated and that the column address signal CA, the read enable signal RE and the write enable signal WE are separated into the two systems are similar to those of the first embodiment.

However, the toggle MRAM 61 in this embodiment differs from the toggle MRAM1 in the first embodiment in the following points. In the first embodiment, each of the memory array A and the memory array B has the sense amplifier (SA_A, SA_B) and the write circuit (WCS_A, WCS_B). Then, the controller 2 outputs the signals to each memory array, each sense amplifier and each write circuit. On the other hand, this embodiment includes the selector 66 for selecting any of the memory array A and the memory array B. The selector 66 treats the transmission/reception of the signals between one of the sense amplifier (SA) and the write circuit (WCS) and one of the memory array A and the memory array B. Consequently, the number of the sense amplifier (SA) and the number of the write circuits (WCS) can be set at 1, respectively.

Consequently, the number of the sense amplifier (SA) and the number of the write circuits (WCS) can be reduced to ½, respectively, as compared with the first embodiment. Moreover, the multiplexer at the later stage of the sense amplifier that is required by the first embodiment can be also reduced. Thus, the circuit area of the toggle MRAM can be reduced.

The configurations with regard to the decoder & memory array A 63*a* and the decoder & memory array B 63*b* are similar to, for example, FIG. 14. The configurations of the sense amplifier 64 and the write circuit 65 are similar to, for example, FIG. 11.

The selector 66 selects any one of the decoder & memory array A 63*a* and the decoder & memory array B 63*b*, and transmits the signal from a write circuit 65 and the signal from controller 62. Also, the signal from any one of the decoder & memory array A 63*a* and the decoder & memory array B 63*b* is selected and outputted to a sense amplifier 64.

Figure 16:
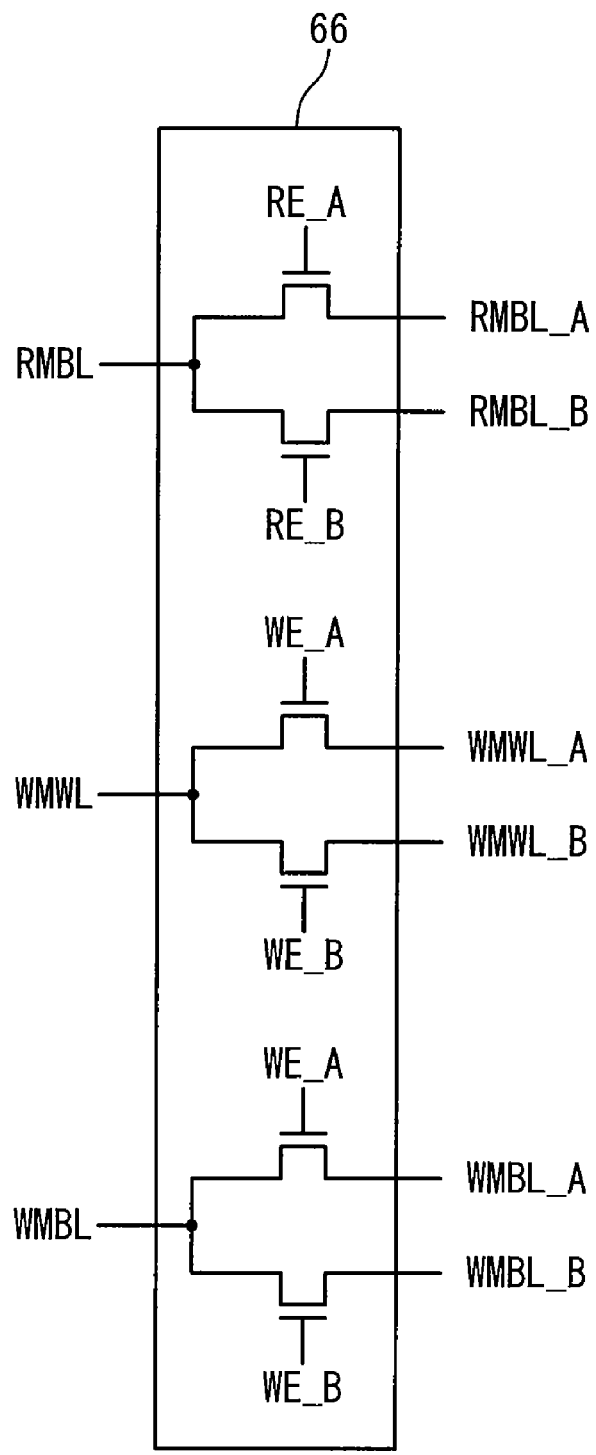
FIG. 16 is a block diagram showing an example of a configuration of a circuit of a selector in the second embodiment of the toggle MRAM of the present invention.

FIG. 16 is a block diagram showing one example of a configuration of the circuit of the selector in the second embodiment of the toggle MRAM of the present invention.

When the read enable signal RE_A is active (at the High level), a read main bit line RMBL_A on the decoder & memory array A 63*a* side is selected and connected to a read main bit line RMBL. Consequently, the memory array A inside the decoder & memory array A63*a* and the sense amplifier 64 are connected. That is, the sense amplifier 64 can carry out the sensing operation of the selection cell in the memory array A. Similarly, when the read enable signal RE_B is active (at the High level), a read main bit line RMBL_B on the decoder & memory array B 63*b* side is selected and connected to the read main bit line RMBL. Consequently, the memory array B inside the decoder &memory array B 63*b* and the sense amplifier 64 are connected. That is, the sense amplifier 64 can carry out the sensing operation of the selection cell in the memory array B. Here, the sense amplifier 64 becomes in the operable state in both of the active states of the RE_A signal and the RE_B signal.

On the other hand, when the write enable signal WE_A is active (at the High level), a write main word line WMWL_A on the decoder & memory array A 63*a* side and a write main bit line WMBL_A are selected and connected to a write main word line WMWL and a write main bit line WMBL, respectively. Consequently, the memory array A inside the decoder &memory array A 63*a* and the write circuit 65 are connected. That is, the write circuit 65 can supply the write currents Ix, Iy to the word line and bit line of the selection cell in the memory array A. Similarly, when the write enable signal WE_B is active (at the High level), a write main word line WMWL_B on the decoder & memory array B 63*b* side and a write main bit line WMBL_B are selected and connected to the write main word line WMWL and the write main bit line WMBL, respectively. Consequently, the memory array B inside the decoder & memory array B 63*b* and the write circuit 65 are connected. That is, the write circuit 65 can supply the write currents Ix, Iy to the word line and bit line of the selection cell in the memory array B. Here, the write circuit 65 becomes in the operable state in both of the active states of the WE_A signal and the WE_B signal.

The continuous burst write operation in the first embodiment of the toggle MRAM of the present invention will be described below.

FIG. 17 is a view showing an example of a timing chart of the continuous burst write operation in the second embodiment of the toggle MRAM of the present invention. Here, (a) shows the clock signal CLK, (b) shows the address signal Address, (c) shows the address/advance signal /ADV, (d) shows the output enable signal /OE, (e) shows the write enable signal /WE, (f) shows the signal Din inputted/outputted through the input/output pins, (g) shows the row address signal RA, (h) shows the column address signal CA_A[y:1] of the decoder & memory array A 63*a*, (i) shows the column address signal CA_B[y:1] of the decoder & memory array B 63*b*, (j) shows the column address signal CA[0], (k) shows the burst address signal BA, (l) shows the read enable signal RE_A of the memory array A, (m) shows the read enable signal RE_B of the memory array B, (n) shows the output signal Q_A of the sense amplifier 64, (o) shows the inner write enable signal WE_A of the memory array A, and (p) shows the inner write enable signal WE_B of the memory array B, respectively.

In this embodiment, similarly to the condition of FIG. 12, the burst length=8 bits (the burst address signal has 3 bits), and the latency=2, and the start address=0. The eight sense amplifiers 64 are prepared.

This operation will be described below for each cycle by using the timing chart shown in FIG. 17.

(1) From 0th to 1st Cycles

The RE_A signal (l) becomes active, and the memory array A and the sense amplifier 64 are connected through the selector 66. The sensing operation for the memory cell A of the RA=0 and CA_A=0 (h) in the memory array A is executed. At this time, the memory array B is not accessed.

(2) From 2nd and 9th Cycles

The WE_A signal (o) becomes active, and the write circuit 65 and the memory array A are connected through the selector 66. The burst write operation for the memory cell A of the RA=0, CA_A=0 (h) in the memory array A is executed. At this time, the sensed results Q0 to Q7 (n) of the memory cells A corresponding to the burst addresses are sequentially outputted, respectively, for the respective cycles. It is determined whether or not the toggle operation is executed, by comparing those sensed results Q0 to Q7(n) with the external data input signals D0 to D7 (f), respectively. Here, from the 2nd to 7th cycles, the memory array B is not accessed. However, from the 8th to 9th cycles, the RE_B signal (m) becomes active, and the memory array B and the sense amplifier 64 are connected through the selector 66.

The sensing operation for the memory cell B of the RA=0, CA_B=0 (i) in the memory array B is executed. That is, these 8th to 9th cycles are in the situation in which similarly to the first embodiment, the burst write operation in the memory array A and the sensing operation in the memory array B are executed at the same time. At this time, since the write current is not supplied to the memory array B, the magnetization state of the memory cell B is stable, which enables the accurate sensing operation.

(3) From 10th to 17th Cycles

The WE_B signal (p) becomes active, and the write circuit 65 and the memory array B are connected through the selector 66. The burst write operation for the memory cell B of the RA=0, CA_B=0 (i) in the memory array B is executed. At this time, the sensed results Q8 to Q15 (n) of the memory cells B corresponding to the burst addresses are sequentially outputted, respectively, for the respective cycles. It is determined whether or not the toggle operation is executed, by comparing those sensed results Q8 to Q15 (n) with the external data input signals D8 to D15 (f), respectively. Here, from the 10th to 15th cycles, the memory array A is not accessed. However, from the 16th to 17th cycles, the RE_A signal (l) becomes active, and the memory array A and the sense amplifier 64 are connected through the selector 66. The sensing operation for the memory cell A of the RA=0, CA_A=1 (h) in the memory array A is executed. These 16th to 17th cycles are in the situation in which the burst write operation in the memory array B and the sensing operation in the memory array A are executed at the same time. At this time, since the write current is not supplied to the memory array A, the magnetization state of the memory cell A is stable, which enables the accurate sensing operation.

(4) From 18th to 25th Cycles

The burst write operation for the memory cell A of the RA=0, CA_A=1 (h) in the memory array A is executed. From the 24th to 25th cycles, in addition to the foregoing operations, the sensing operation for the memory cell B of the RA=0, CA_B=1 (i) in the memory array B is executed.

(5) From 26th to 33rd Cycles

The burst write operation for the memory cell B of the RA=0, CA_B=1 (i) in the memory array B is executed. From the 32nd to 33rd cycles, in addition to the foregoing operations, the sensing operation for the memory cell A of the RA=0, CA_A=2 (h) in the memory array A is executed.

Since the foregoing operations are repeatedly executed until the final address of the column address CA, the continuous burst write operation can be executed without any erroneous operation.

As shown in FIG. 17, even this embodiment in which the selector 66 is introduced and the numbers of the sense amplifiers 64 and the write circuits 65 are reduced can be operated perfectly similar to the continuous burst write operation explained in the first embodiment. Also, such as the case of FIG. 13 in the first embodiment, even in this embodiment, its operations are never based on the address of the start address.

Even in the other operational modes, namely, the continuous burst read operation and the usual burst write/read operation, it can be operated without any change and addition of the circuit configuration.

In this way, even in this embodiment, it can be attained without any generation of the drop factor in the reliability of the write operation such as the erroneous operation of the continuous burst write operation and without any increase in the circuit area while the continuous burst write operation is made faster.

The specific configurations of the present invention are not limited to the above-mentioned respective embodiments. The change of the design and the like in the range without departing from the scope and spirit of the present invention may be allowed. Also, the toggle MRAM that is operated based on the above-mentioned technical ideas is obviously within the range of the present invention.

For example, in the above-mentioned embodiments, the data input output signal is assumed to have one bit. However, this is allowed to have the plurality of input output pins. In the above-mentioned embodiments, the latency=2 is assumed. However, within the range that does not extend the burst length, the latency can be arbitrarily set. In the above-mentioned embodiments, although the burst length=8 bits is assumed, the burst length can be arbitrarily set.

In the present invention, the memory array A and the memory array B may have the hierarchical array structure in which they are further divided into the memory arrays of the small memory capacities. In the present invention, the column address signals CA_A and CA_B may carry out the AND logic between the read enable signals RE_A and RE_B, respectively, and select the selection bit lines at the time of the sensing operation. In the present invention, the column address signals CA_A and CA_B may carry out the AND logic between the write enable signals WE_A and WE_B, respectively, and select the selection bit lines at the time of the write operation.

In the present invention, the increment in the column address and burst address at the time of the continuous burst operation may be irregular. At this time, the memory array A and the memory array B have no problem even if they are not divided at the least significant bit of the column address. Also, the physical allocation of the column address is not limited to FIGS. 10A to 10C. The circuit configuration around the sense amplifier and the write circuit is not limited to FIG. 11.

In the present invention, the toggle MRAM is assumed. However, this can be also applied to the typical MRAM. For example, this can be used in a case in which the verification is carried out after the writing and then the rewriting is carried out as necessary.

The invention claimed is:

1. A toggle magnetic random access memory comprising:
    a first memory array configured to include a plurality of first memory cells including magnetoresistive elements;
    a second memory array configured to include a plurality of second memory cells including magnetoresistive elements and differ from said first memory array in write wirings used for writing; and
    a controller configured to control said first memory array and said second memory array such that a first state in which a first burst write operation in said first memory array is executed and a second state in which a second burst write operation in said second memory array is executed are alternately executed in a continuous burst write mode.

2. The toggle magnetic random access memory according to claim 1, wherein said first memory array and said second memory array input and output data from the same input-output pins.

3. The toggle magnetic random access memory according to claim 1, wherein said first memory array or said second memory array includes:
    a plurality of write word lines configured to extend in a first direction as one of said write wirings, and
    a plurality of bit lines configured to extend in a second direction as the other one of said write wirings,
    wherein each of said plurality of first memory cells or each of said plurality of second memory cells is arranged at each of intersections between said plurality of write word lines and said plurality of bit lines, and
    in said magnetoresistive elements, a free layer is a laminated free layer and a magnetization easy axis direction is a direction dislocated at about 45 degrees from the first direction.

4. The toggle magnetic random access memory according to claim 3, wherein said write operation to each of said plurality of memory cells is executed by a series of current controls, which supplies a first write current to a selected write word line selected from said plurality of write word lines, and then supplies a second write current to a selected bit line selected from said plurality of bit lines, and after that, stops said first write current and then stops said second write current.

5. The toggle magnetic random access memory according to claim 1, wherein said controller controls said first memory array and said second memory array such that said first burst write operation and said second burst write operation are not executed at said same time.

6. The toggle magnetic random access memory according to claim 1, wherein said controller controls said first memory array and said second memory array such that a second sensing operation is performed on a second memory cell targeted for next said second burst write operation among said plurality of second memory cells in said first state and a first sensing operation is performed on a first memory cell targeted for next said first burst write operation among said plurality of first memory cells in said second state.

7. The toggle magnetic random access memory according to claim 6, wherein said controller controls said first memory array and said second memory array such that said first sensing operation and second sensing operation and said first burst write operation and second burst write operation are executed synchronously with a clock signal inputted from outside.

8. The toggle magnetic random access memory according to claim 1, said controller inserts a data, which indicates which of said first state and second state is firstly executed, into an address signal and outputs said address signal to said first memory array and said second memory array.

9. The toggle magnetic random access memory according to claim 1, wherein said controller outputs a first address signal to said first memory array at said time of said first burst write operation and outputs a second address signal to said second memory array at said time of said second burst write operation,
    wherein said first memory array selects a selected first cell from said plurality of first memory cells on the basis of said first address signal,
    wherein said second memory array selects a selected second cell from said plurality of second memory cells on the basis of said second address signal, and
    wherein said first address signal and said second address signal are alternately changed at timings different from each other.

10. The toggle magnetic random access memory according to claim 9, wherein said controller controls said first memory array such that said first sensing operation is performed in advance for a first memory cell targeted for next said first burst write operation among said plurality of first memory cells, before said first burst write operation is started, and does not change said first address signal until said first burst write operation completion after said first sensing operation start, and controls said second memory array such that said second sensing operation is performed in advance for a second memory cell targeted for next said second burst write operation among said plurality of second memory cells, before said second burst write operation is started, and does not change said second address signal until said second burst write operation completion after said second sensing operation start.

11. The toggle magnetic random access memory according to claim 10, wherein said controller changes said first address signal when said first sensing operation is started, and changes said second address signal when said second sensing operation is started.

12. The toggle magnetic random access memory according to claim 11, wherein an address after said change of said second address signal is equal to an address of said first address signal at the time when said second address signal is changed.

13. The toggle magnetic random access memory according to claim 9, wherein said controller generates said first address signal and said second address signal on the basis of said address signal inputted from outside.

14. In said toggle magnetic random access memory according to claim 10, wherein said controller generates a first read enable signal for controlling said first sensing operation and a second read enable signal for controlling said second sensing operation on the basis of said address signal and a command signal inputted from said outside.

15. The toggle magnetic random access memory according to claim 14, wherein said controller generates a first write enable signal for controlling said first burst write operation and a second write enable signal for controlling said second burst write operation on the basis of said address signal and said command signal.

16. The toggle magnetic random access memory according to claim 15, wherein said controller outputs said first write enable signal having a clock delay of at least one cycle with respect to said first read enable signal and outputs said second write enable signal having a clock delay of at least one cycle with respect to said second read enable signal.

17. The toggle magnetic random access memory according to claim 9, wherein said controller generates a row address signal for selecting rows in said first memory array and said second memory array, a first column address signal for selecting a column in said first memory array, and a second column address signal for selecting a column in said second memory array, for said address signal inputted from said outside.

18. The toggle magnetic random access memory according to claim 17, wherein said controller increases said first column address signal and said second column address signal, respectively, in synchronization with said clock signal.

19. The toggle magnetic random access memory according to claim 17, wherein said controller allocates least significant bits of said first column address signal and said second column address signal to said first memory array and said second memory array, respectively.

20. The toggle magnetic random access memory according to claim 19, wherein said controller inserts a data, which indicates which of said first memory array and second memory array is firstly accessed, into said least significant bits of said first column address signal and said second column address signal in an initial states.

21. The toggle magnetic random access memory according to claim 19, wherein said controller outputs any one of said first read enable signal with regard to said first sensing operation of said first memory array and said second read enable signal with regard to said second sensing operation of said second memory array, on said basis of said least significant bits of said first column address signal and said second column address signal in an initial states.

22. The toggle magnetic random access memory according to claim 17, wherein in said controller, said first column address signal except said least significant bit is said first address signal, and said second column address signal except said least significant bit is said second address signal.

23. The toggle magnetic random access memory according to claim 17, wherein said controller generates a burst address signal for selecting columns in said first memory array and said second memory array on the basis of an address signal inputted from said outside, and said burst address signal is continuously increased for each cycle of said clock signal.

24. The toggle magnetic random access memory according to claim 23, wherein said controller increases a value, in which said burst address signal is defined as said lower-order bit and each of said first column address signal and said second column address signal is defined as a high-order bit, continuously for each cycle of said clock signal.

25. The toggle magnetic random access memory according to claim 21, further comprising:

a plurality of first sense amplifying circuits configured to sense data of a plurality of selected first cells selected from said plurality of first memory cells by said row address signal and said first column address signal, when said first read enable signal is active; and a plurality of second sense amplifying circuits configured to sense data of a plurality of selected second cells selected from said plurality of second memory cells by said row address signal and said second column address signal, when said second read enable signal is active, wherein each of said plurality of first sense amplifying circuits and each of said plurality of second sense amplifying circuits are allocated to said burst address signal.

26. The toggle magnetic random access memory according to claim 25, wherein said plurality of first sense amplifying circuits are respectively operated at the same time, and said plurality of second sense amplifying circuits are respectively operated at the same time.

27. The toggle magnetic random access memory according to claim 25, wherein said controller inputs said burst address signal, which has a clock delay of at least one cycle with respect to said first column address signal and said second column address signal, to said first memory array and said second memory array, and each of said plurality of first sense amplifying circuits and each of said second sense amplifying circuits.

28. The toggle magnetic random access memory according to claim 25, further comprising:

a plurality of first registers configured to temporally store sensed results of said plurality of first sense amplifying circuits; and a plurality of second registers configured to temporally store sensed results of said plurality of second sense amplifying circuits.

29. The toggle magnetic random access memory according to claim 28, wherein said plurality of first registers and said plurality of second registers output only said sensed results corresponding to said burst address signal.

30. The toggle magnetic random access memory according to claim 28, wherein said controller outputs control signals, which correspond to said least significant bits of said first column address signal and said second column address signal and have the same clock delay as said latency of said burst address signal, and said toggle magnetic random access memory further comprising:
a multiplexer configured to output any output signal of said plurality of first registers and said plurality of second registers on the basis of said control signals,
wherein said output signal of said multiplexer is a data output signal.

31. The toggle magnetic random access memory according to claim 28, further comprising:
a first write circuit configured to supply a first write current and a second write circuit to a first write word line and a plurality of first bit lines, respectively, of a plurality of selected first cells selected from said plurality of first memory cells on the basis of a row address signal, a first column address signal and a burst address signal, when a first write enable signal for controlling said first burst write operation is active; and
a second write circuit configured to supply a third write current and a fourth write circuit to a second write word line and a plurality of second bit lines, respectively, of a plurality of selected second cells selected from said plurality of second memory cells on the basis of a row address signal, a second column address signal and a burst address signal, when a second write enable signal for controlling said second burst write operation is active.

32. The toggle magnetic random access memory according to claim 31, wherein said first write circuit supplies said first write current ahead of said second write current and stops said first write current ahead of said second write current, and
said second write circuit supplies said third write current ahead of said fourth write current and stops said third write current ahead of said fourth write current.

33. The toggle magnetic random access memory according to claim 31, wherein said first write circuit includes:
a first determining circuit configured to compare an output signal of each of said plurality of first registers with a data input signal inputted from outside,
wherein, on the basis of said comparison result, when both are different, said first determining circuit supplies said first write current and said second write current, and when both are equal, said first determining circuit does not supply them,
wherein said second write circuit includes:
a second determining circuit configured to compare an output signal of each of said plurality of second registers with a data input signal inputted from outside,
wherein, on the basis of said compared result, when both are different, said second determining circuit supplies said third write current and said fourth write current, and when both are equal, said second determining circuit does not supply them.

34. The toggle magnetic random access memory according to claim 21, further comprising:
a plurality of third sense amplifying circuits configured to be operated when said first read enable signal and said second read enable signal are active,
wherein each of said plurality of third sense amplifying circuits is allocated to said burst address signal.

35. The toggle magnetic random access memory according to claim 34, further comprising:
a plurality of third registers configured to temporally hold sensed results of said plurality of third sense amplifying circuits,
wherein said plurality of third registers outputs only a sensed result corresponding to said burst address signal, and said outputted sensed result is said data output signal.

36. The toggle magnetic random access memory according to claim 34, further comprising:
a selector configured to connects inputs of said plurality of third sense amplifying circuits to said first memory array on the basis of said first read enable signal and connects said inputs to said second memory array on the basis of said second read enable signal.

37. The toggle magnetic random access memory according to claim 34, further comprising:
a third write circuit configured to supply said first write current and said second write current when said first read enable signal is active, and supply said third write current and said fourth write current when said second read enable signal is active; and
a third determining circuit configured to compare an output signal of each of said plurality of third registers with a data input signal inputted from said outside,
wherein, on the basis of said compared result, when both are different, said third write circuit supplies said first write current and second write current, or said third write current and fourth write current, and when both are equal, said third write circuit does not supply them.

38. The toggle magnetic random access memory according to claim 37, further comprising:
a selector configured to connect said third write circuit to said first memory array on the basis of said first write enable signal and connect said third write circuit to said second memory array on the basis of said second write enable signal.

39. A write method of a toggle magnetic random access memory, wherein said toggle magnetic random access memory includes:
a first memory array configured to include a plurality of first memory cells including magnetoresistive elements, and
a second memory array configured to include a plurality of second memory cells including magnetoresistive elements and differs from said first memory array in write wirings used for writing,
wherein said magnetoresistive elements are such that a free layer is said laminated free layer and such that a magnetization easy axis direction is a direction dislocated at about 45 degrees with respect to a write word line,
wherein said write method comprising:
(a) executing a first burst write operation in said first memory array through a toggle writing, at a continuous burst write mode; and
(b) executing a second burst write operation in said second memory array through a toggle writing,
wherein said (a) and (b) steps are repeated until a completion of said continuous burst write mode.

40. The write method of said toggle magnetic random access memory according to claim 39, wherein said step (a) includes:
(a1) performing a first sensing operation for first memory cells targeted for said first burst write operation, among said plurality of first memory cells, prior to said first burst write operation, wherein said step (b) includes:
(b1) performing a second sensing operation for second memory cells targeted for said second burst write operation, among said plurality of second memory cells, prior to said second burst write operation.

* * * * *